US012100684B2

(12) United States Patent
Wang et al.

(10) Patent No.: US 12,100,684 B2
(45) Date of Patent: Sep. 24, 2024

(54) BONDED STRUCTURES

(71) Applicant: ADEIA SEMICONDUCTOR BONDING TECHNOLOGIES INC., San Jose, CA (US)

(72) Inventors: Liang Wang, Milpitas, CA (US); Rajesh Katkar, San Jose, CA (US); Javier A. DeLaCruz, San Jose, CA (US); Arkalgud R. Sitaram, Cupertino, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 18/147,212

(22) Filed: Dec. 28, 2022

(65) Prior Publication Data
US 2023/0361072 A1 Nov. 9, 2023

Related U.S. Application Data

(63) Continuation of application No. 17/131,588, filed on Dec. 22, 2020, now Pat. No. 11,670,615, which is a
(Continued)

(51) Int. Cl.
*H01L 23/00* (2006.01)
*B81C 1/00* (2006.01)
(Continued)

(52) U.S. Cl.
CPC .......... *H01L 24/29* (2013.01); *B81C 1/00269* (2013.01); *B81C 1/00293* (2013.01);
(Continued)

(58) Field of Classification Search
CPC . H01L 23/10; H01L 23/49838; H01L 23/529; H01L 23/53228; H01L 23/53242;
(Continued)

(56) References Cited

U.S. PATENT DOCUMENTS

| 4,998,665 A | 3/1991 | Hayashi |
| 5,087,585 A | 2/1992 | Hayashi |

(Continued)

FOREIGN PATENT DOCUMENTS

| CN | 101554988 | 10/2009 |
| CN | 109390305 A | 2/2019 |

(Continued)

OTHER PUBLICATIONS

Amirfeiz et al., "Formation of silicon structures by plasma-activated wafer bonding," Journal of the Electrochemical Society, 2000, vol. 147, No. 7, pp. 2693-2698.
(Continued)

*Primary Examiner* — Jasmine J Clark
(74) *Attorney, Agent, or Firm* — Knobbe, Martens, Olson & Bear, LLP

(57) ABSTRACT

A bonded structure can include a first element having a first conductive interface feature and a second element having a second conductive interface feature. An integrated device can be coupled to or formed with the first element or the second element. The first conductive interface feature can be directly bonded to the second conductive interface feature to define an interface structure. The interface structure can be disposed about the integrated device in an at least partially annular profile to connect the first and second elements.

26 Claims, 21 Drawing Sheets

Related U.S. Application Data continuation of application No. 16/724,017, filed on Dec. 20, 2019, now Pat. No. 10,879,207, which is a continuation of application No. 15/979,312, filed on May 14, 2018, now Pat. No. 10,546,832, which is a continuation of application No. 15/387,385, filed on Dec. 21, 2016, now Pat. No. 10,002,844.

(51) Int. Cl.
    *H01L 23/10* (2006.01)
    *H01L 23/498* (2006.01)
    *H01L 23/528* (2006.01)
    *H01L 23/532* (2006.01)
    *H05K 1/11* (2006.01)

(52) U.S. Cl.
    CPC ........ *H01L 23/10* (2013.01); *H01L 23/49838* (2013.01); *H01L 23/528* (2013.01); *H01L 23/53228* (2013.01); *H01L 23/53242* (2013.01); *H01L 24/05* (2013.01); *H01L 24/06* (2013.01); *H01L 24/08* (2013.01); *B81B 2207/012* (2013.01); *B81C 2203/035* (2013.01); *H01L 23/562* (2013.01); *H01L 24/80* (2013.01); *H01L 2224/05551* (2013.01); *H01L 2224/05552* (2013.01); *H01L 2224/05555* (2013.01); *H01L 2224/05571* (2013.01); *H01L 2224/05647* (2013.01); *H01L 2224/05686* (2013.01); *H01L 2224/06135* (2013.01); *H01L 2224/06155* (2013.01); *H01L 2224/06165* (2013.01); *H01L 2224/06505* (2013.01); *H01L 2224/08121* (2013.01); *H01L 2224/08237* (2013.01); *H01L 2224/29019* (2013.01); *H01L 2224/8001* (2013.01); *H01L 2224/80047* (2013.01); *H01L 2224/80895* (2013.01); *H01L 2224/80896* (2013.01); *H01L 2224/80948* (2013.01); *H05K 1/111* (2013.01)

(58) Field of Classification Search
    CPC ......... H01L 24/29; H01L 24/05; H01L 24/06; H01L 24/08; B81C 1/002; B81C 1/93; B81C 1/00269
    USPC ........................................................ 257/782
    See application file for complete search history.

(56) References Cited

U.S. PATENT DOCUMENTS

| | | |
|---|---|---|
| 5,322,593 A | 6/1994 | Hasegawa et al. |
| 5,753,536 A | 5/1998 | Sugiyama et al. |
| 5,771,555 A | 6/1998 | Eda et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,265,775 B1 | 7/2001 | Seyyedy |
| 6,374,770 B1 | 4/2002 | Lee |
| 6,423,640 B1 | 7/2002 | Lee et al. |
| 6,465,892 B1 | 10/2002 | Suga |
| 6,872,984 B1 | 3/2005 | Leung |
| 6,876,062 B2 | 4/2005 | Lee et al. |
| 6,887,769 B2 | 5/2005 | Kellar et al. |
| 6,908,027 B2 | 6/2005 | Tolchinsky et al. |
| 6,998,712 B2 | 2/2006 | Okada et al. |
| 7,045,453 B2 | 5/2006 | Canaperi et al. |
| 7,057,274 B2 | 6/2006 | Heschel |
| 7,078,811 B2 | 7/2006 | Suga |
| 7,105,980 B2 | 9/2006 | Abbott et al. |
| 7,193,423 B1 | 3/2007 | Dalton et al. |
| 7,354,798 B2 | 4/2008 | Pogge et al. |
| 7,359,591 B2 | 4/2008 | Vandentop et al. |
| 7,388,281 B2 | 6/2008 | Krueger et al. |
| 7,467,897 B2 | 12/2008 | Hauffe et al. |
| 7,622,324 B2 | 11/2009 | Enquist et al. |
| 7,750,488 B2 | 7/2010 | Patti et al. |
| 7,768,133 B2 | 8/2010 | Matsui et al. |
| 7,803,693 B2 | 9/2010 | Trezza |
| 7,972,683 B2 | 7/2011 | Gudeman et al. |
| 8,183,127 B2 | 5/2012 | Patti et al. |
| 8,191,756 B2 | 6/2012 | Coppeta et al. |
| 8,241,961 B2 | 8/2012 | Kim et al. |
| 8,269,671 B2 | 9/2012 | Chen et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,395,229 B2 | 3/2013 | Garcia-Blanco et al. |
| 8,411,444 B2 | 4/2013 | Gaynes et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,530,997 B1 | 9/2013 | Yang et al. |
| 8,546,928 B2 | 10/2013 | Merz et al. |
| 8,620,164 B2 | 12/2013 | Heck et al. |
| 8,647,987 B2 | 2/2014 | Yang et al. |
| 8,669,602 B2 | 3/2014 | Hayashi |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,988,299 B2 | 3/2015 | Kam et al. |
| 9,093,350 B2 | 7/2015 | Endo et al. |
| 9,119,313 B2 | 8/2015 | Zhang et al. |
| 9,142,517 B2 | 9/2015 | Liu et al. |
| 9,142,532 B2 | 9/2015 | Suga et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,318,471 B2 | 4/2016 | Kabe et al. |
| 9,337,235 B2 | 5/2016 | Chen et al. |
| 9,368,866 B2 | 6/2016 | Yu |
| 9,385,024 B2 | 7/2016 | Tong et al. |
| 9,386,688 B2 | 7/2016 | MacDonald et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,601,454 B2 | 3/2017 | Zhao et al. |
| 9,620,464 B2 | 4/2017 | Baks et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,307 B2 | 9/2017 | Yamazaki et al. |
| 9,799,587 B2 | 10/2017 | Fujii et al. |
| 9,834,435 B1 | 12/2017 | Liu et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |

(56) References Cited

U.S. PATENT DOCUMENTS

| | | | |
|---|---|---|---|
| 10,002,844 B1* | 6/2018 | Wang | H01L 24/29 |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2* | 12/2019 | Enquist | H01L 24/05 |
| 10,546,832 B2* | 1/2020 | Wang | H01L 23/49838 |
| 10,615,133 B2 | 4/2020 | Kamgaing et al. | |
| 10,658,312 B2 | 5/2020 | Kamgaing et al. | |
| 10,707,087 B2 | 7/2020 | Uzoh et al. | |
| 10,727,219 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,207 B2* | 12/2020 | Wang | H01L 24/06 |
| 10,879,210 B2* | 12/2020 | Enquist | H01L 23/10 |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,503 B2 | 5/2021 | Wang et al. | |
| 11,031,285 B2 | 6/2021 | Katkar et al. | |
| 11,056,348 B2 | 7/2021 | Theil | |
| 11,088,099 B2 | 8/2021 | Katkar et al. | |
| 11,127,738 B2 | 9/2021 | DeLaCruz et al. | |
| 11,158,606 B2 | 10/2021 | Gao et al. | |
| 11,171,117 B2 | 11/2021 | Gao et al. | |
| 11,176,450 B2 | 11/2021 | Teig et al. | |
| 11,205,600 B2 | 12/2021 | Shen et al. | |
| 11,256,004 B2 | 2/2022 | Haba et al. | |
| 11,257,727 B2 | 2/2022 | Katkar et al. | |
| 11,264,357 B1 | 3/2022 | DeLaCruz et al. | |
| 11,276,676 B2 | 3/2022 | Enquist et al. | |
| 11,329,034 B2 | 5/2022 | Tao et al. | |
| 11,348,898 B2 | 5/2022 | DeLaCruz et al. | |
| 11,355,443 B2 | 6/2022 | Huang et al. | |
| 11,380,597 B2 | 7/2022 | Katkar et al. | |
| 11,417,576 B2 | 8/2022 | Katkar et al. | |
| 11,485,670 B2 | 11/2022 | Ruben et al. | |
| 11,600,542 B2 | 3/2023 | Huang et al. | |
| 11,670,615 B2* | 6/2023 | Wang | H01L 24/29 257/782 |
| 2002/0000328 A1 | 1/2002 | Motomura et al. | |
| 2002/0003307 A1 | 1/2002 | Suga | |
| 2002/0094608 A1 | 7/2002 | Brooks | |
| 2002/0179921 A1 | 12/2002 | Cohn | |
| 2003/0098060 A1 | 5/2003 | Yoshimi | |
| 2004/0084414 A1 | 5/2004 | Sakai et al. | |
| 2004/0120245 A1 | 6/2004 | Arikawa et al. | |
| 2004/0259325 A1 | 12/2004 | Gan | |
| 2005/0009246 A1 | 1/2005 | Enquist et al. | |
| 2005/0082653 A1 | 4/2005 | McWilliams et al. | |
| 2005/0263866 A1 | 12/2005 | Wan | |
| 2006/0001123 A1 | 1/2006 | Heck et al. | |
| 2006/0057945 A1 | 3/2006 | Hsu et al. | |
| 2006/0097335 A1 | 5/2006 | Kim et al. | |
| 2006/0115323 A1 | 6/2006 | Coppeta et al. | |
| 2006/0197215 A1 | 9/2006 | Potter | |
| 2006/0208326 A1 | 9/2006 | Nasiri et al. | |
| 2007/0029562 A1 | 2/2007 | Koizumi | |
| 2007/0045781 A1 | 3/2007 | Carlson et al. | |
| 2007/0045795 A1 | 3/2007 | McBean | |
| 2007/0096294 A1 | 5/2007 | Ikeda et al. | |
| 2007/0111386 A1 | 5/2007 | Kim et al. | |
| 2007/0134891 A1 | 6/2007 | Adetutu et al. | |
| 2007/0188054 A1 | 8/2007 | Hasken et al. | |
| 2007/0222048 A1 | 9/2007 | Huang | |
| 2007/0295456 A1 | 12/2007 | Gudeman et al. | |
| 2008/0080832 A1 | 4/2008 | Chen et al. | |
| 2008/0124835 A1 | 5/2008 | Chen et al. | |
| 2008/0283995 A1 | 11/2008 | Bucki et al. | |
| 2008/0290490 A1 | 11/2008 | Fujii et al. | |
| 2008/0296709 A1 | 12/2008 | Haba et al. | |
| 2009/0053855 A1 | 2/2009 | Summers | |
| 2009/0186446 A1 | 7/2009 | Kwon et al. | |
| 2009/0267165 A1 | 10/2009 | Okudo et al. | |
| 2010/0078786 A1 | 4/2010 | Maeda | |
| 2010/0096713 A1 | 4/2010 | Jung | |
| 2010/0148341 A1 | 6/2010 | Fuji et al. | |
| 2010/0181676 A1 | 7/2010 | Montez et al. | |
| 2010/0288525 A1 | 11/2010 | Basavanhally et al. | |
| 2010/0301432 A1 | 12/2010 | Kittilsland et al. | |
| 2011/0031633 A1 | 2/2011 | Hsu et al. | |
| 2011/0115092 A1 | 5/2011 | Tago | |
| 2011/0147859 A1 | 6/2011 | Tanaka et al. | |
| 2011/0156242 A1 | 6/2011 | Sakaguchi et al. | |
| 2011/0180921 A1 | 7/2011 | Loiselet | |
| 2011/0290552 A1 | 12/2011 | Palmateer et al. | |
| 2012/0061776 A1 | 3/2012 | Cheng et al. | |
| 2012/0097733 A1 | 4/2012 | Ebefors et al. | |
| 2012/0100657 A1 | 4/2012 | Di Cioccio et al. | |
| 2012/0112335 A1 | 5/2012 | Ebefors et al. | |
| 2012/0142144 A1 | 6/2012 | Taheri | |
| 2012/0212384 A1 | 8/2012 | Kam et al. | |
| 2012/0267730 A1 | 10/2012 | Renard et al. | |
| 2012/0286380 A1 | 11/2012 | Yazdi et al. | |
| 2012/0326248 A1 | 12/2012 | Daneman et al. | |
| 2013/0099331 A1 | 4/2013 | Chen et al. | |
| 2013/0122702 A1 | 5/2013 | Volant et al. | |
| 2013/0187245 A1 | 7/2013 | Chien et al. | |
| 2013/0271066 A1 | 10/2013 | Signorelli et al. | |
| 2013/0277774 A1 | 10/2013 | Frey et al. | |
| 2013/0277777 A1 | 10/2013 | Chang et al. | |
| 2013/0293428 A1 | 11/2013 | Souriau et al. | |
| 2014/0042593 A1 | 2/2014 | Mauder et al. | |
| 2014/0175655 A1 | 6/2014 | Chen et al. | |
| 2014/0197534 A1 | 7/2014 | Partosa et al. | |
| 2014/0217557 A1 | 8/2014 | Chen et al. | |
| 2014/0225206 A1 | 8/2014 | Lin et al. | |
| 2014/0225795 A1 | 8/2014 | Yu | |
| 2014/0264653 A1 | 9/2014 | Cheng et al. | |
| 2014/0361413 A1 | 12/2014 | Chapelon | |
| 2015/0001632 A1 | 1/2015 | Liu et al. | |
| 2015/0064498 A1 | 3/2015 | Tong | |
| 2015/0068666 A1 | 3/2015 | Abe et al. | |
| 2015/0091153 A1 | 4/2015 | Liu et al. | |
| 2015/0097215 A1 | 4/2015 | Chu et al. | |
| 2015/0137345 A1 | 5/2015 | Choi et al. | |
| 2015/0298965 A1 | 10/2015 | Tsai et al. | |
| 2015/0336790 A1 | 11/2015 | Geen et al. | |
| 2015/0336792 A1 | 11/2015 | Huang et al. | |
| 2016/0002029 A1 | 1/2016 | Nasiri et al. | |
| 2016/0107881 A1 | 4/2016 | Thompson et al. | |
| 2016/0137492 A1 | 5/2016 | Cheng et al. | |
| 2016/0146851 A1 | 5/2016 | Kamisuki | |
| 2016/0229685 A1 | 8/2016 | Boysel | |
| 2016/0240495 A1 | 8/2016 | Lachner et al. | |
| 2016/0318757 A1 | 11/2016 | Chou et al. | |
| 2016/0343682 A1 | 11/2016 | Kawasaki | |
| 2017/0001858 A1 | 1/2017 | Adams et al. | |
| 2017/0008757 A1 | 1/2017 | Cheng et al. | |
| 2017/0062366 A1 | 3/2017 | Enquist | |
| 2017/0081181 A1 | 3/2017 | Zhang et al. | |
| 2017/0137281 A1 | 5/2017 | Favier et al. | |
| 2017/0179029 A1 | 6/2017 | Enquist et al. | |
| 2017/0186732 A1 | 6/2017 | Chu et al. | |
| 2017/0194271 A1 | 7/2017 | Hsu et al. | |
| 2017/0200711 A1 | 7/2017 | Uzoh et al. | |

(56) References Cited

U.S. PATENT DOCUMENTS

| | | |
|---|---|---|
| 2017/0305738 A1 | 10/2017 | Chang et al. |
| 2017/0338214 A1 | 11/2017 | Uzoh et al. |
| 2018/0044175 A1 | 2/2018 | Ogashiwa et al. |
| 2018/0047682 A1 | 2/2018 | Chang et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2019/0051628 A1 | 2/2019 | Liu et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0164914 A1 | 5/2019 | Hu et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0363079 A1 | 11/2019 | Thei et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043817 A1 | 2/2020 | Shen et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0131028 A1 | 4/2020 | Cheng et al. |
| 2020/0140267 A1 | 5/2020 | Katkar et al. |
| 2020/0140268 A1 | 5/2020 | Katkar et al. |
| 2020/0144217 A1 | 5/2020 | Enquist et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0134689 A1 | 5/2021 | Huang et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202428 A1 | 7/2021 | Wang et al. |
| 2021/0242152 A1 | 8/2021 | Fountain, Jr. et al. |
| 2021/0265227 A1 | 8/2021 | Katkar et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0367302 A1 | 11/2022 | Katkar et al. |
| 2022/0415734 A1 | 12/2022 | Katkar et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0260858 A1 | 8/2023 | Huang et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420313 A1 | 12/2023 | Katkar et al. |
| 2024/0038702 A1 | 2/2024 | Uzoh |
| 2024/0055407 A1 | 2/2024 | Workman et al. |
| 2024/0079376 A1 | 3/2024 | Suwito et al. |

FOREIGN PATENT DOCUMENTS

| | | |
|---|---|---|
| EP | 2813465 A1 | 12/2014 |
| JP | H10-112517 | 4/1998 |
| JP | 2000-100679 | 4/2000 |
| JP | 2001-102479 | 4/2001 |
| JP | 2001-148436 | 5/2001 |
| JP | 2002-353416 | 12/2002 |
| JP | 2008-130915 | 6/2008 |
| JP | 2009-039843 | 2/2009 |
| JP | 2009-238905 | 10/2009 |
| JP | 2010-199608 | 9/2010 |
| JP | 2011-131309 | 7/2011 |
| JP | 2013-33786 | 2/2013 |
| JP | 2013-513227 | 4/2013 |
| JP | 2013-243333 | 12/2013 |
| JP | 2014-219321 | 11/2014 |
| JP | 2015-100886 | 6/2015 |
| JP | 2015-153791 | 8/2015 |
| JP | 2016-099224 | 5/2016 |
| JP | 2018-160519 | 10/2018 |
| KR | 10-2005-0101324 | 10/2005 |
| KR | 10-2015-0097798 | 8/2015 |

(56) References Cited

FOREIGN PATENT DOCUMENTS

| KR | 10-2017-0108143 | | 9/2017 |
|---|---|---|---|
| TW | 201210098 | A1 | 3/2012 |
| TW | 201423876 | A | 6/2014 |
| TW | 201517175 | A | 5/2015 |
| TW | I533399 | B | 5/2016 |
| WO | WO 2005/043584 | A2 | 5/2005 |
| WO | WO 2006/100444 | A1 | 9/2006 |
| WO | WO 2007/103224 | A2 | 9/2007 |
| WO | WO 2012/130730 | A1 | 10/2012 |
| WO | WO 2014-074403 | A1 | 5/2014 |
| WO | WO 2017/100256 | A1 | 6/2017 |
| WO | WO 2017/151442 | A1 | 9/2017 |

OTHER PUBLICATIONS

Beer et al., "Coplanar 122GHz Antenna Array With Air Cavity Reflector for Integration in Plastic Packages", IEEE Antennas and Wireless Propagation Letters, 11:160-163, Jan. 2012.

Boyle et al., "Epoxy Resins," 2001, pp. 78-89, vol. 21, ASM Handbook, Composites (ASM International).

Chipscale Review, "The Impact of CSPs on Encapsulation Materials," ChipScale Review publication issue Mar. 1998, retrieved Feb. 21, 2014, 6 pages.

Chiueh, Herming et al., "A Dynamic Thermal Management Circuit for System-On-Chip Designs," Analog Integrated Circuits and Signal Processing, Jan. 25, 2003, 36, pp. 175-181.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Das, Rabindra N. et al., "Package-Interpose-Package (PIP) Technology for High End Electronics," Endicott Interconnect Technologies, Inc., retrieved Jul. 31, 2014, 4 pages.

Dreiza, Moody et al., "Joint Project for Mechanical Qualification of Next Generation High DensityPackage-on-Package (POP) with Through Mold Via Technology," Amkor Technology, EMPC2009—17th European Microelectronics & Packaging Conference, Jun. 16, Remini, Italy, 8 pages.

Daneman, "Applying the CMOS Test Flow to MEMS Manufacturing", InvenSense, Inc., accessed on Apr. 5, 2020.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Gu et al., "A Multilayer Organic Package with 64 Dual-Polarized Antennas for 28GHz 5G Communication", IBM Research, pp. 1-3, 2017.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indium Phosphide and Related Materials, 2001, IEEE International Conference on, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

Inertial MEMS Manufacturing Trends 2014 Report by Yole Developpement Sample Report, Slide 11, https://www.slideshare.net/Yole_Developpement/yole-inertial-memsmanufacturingtrends2014sample.

International Search Report and Written Opinion mailed Apr. 13, 2018 in International Application No. PCT/US2017/067742, 14 pages.

International Search Report and Written Opinion mailed Apr. 16, 2018 in International Application No. PCT/US2017/067741, 17 pages.

International Search Report and Written Opinion mailed May 31, 2018 in International Application No. PCT/US2018/022688, 2 pages.

International Search Report and Written Opinion mailed Mar. 7, 2019, in International Application No. PCT/US2018/060044, 14 pages.

International Search Report and Written Opinion mailed Apr. 22, 2019 in International Application No. PCT/US2018/064982, 13 pages.

International Search Report and Written Opinion mailed Aug. 26, 2019 in International Application No. PCT/US2019/031113, 14 pages.

Itoh et al., "Characteristics of fritting contacts utilized for micromachined wafer probe cards," 2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Kim et al., "Low temperature direct Cu—Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—CU, Cu—Si, and Cu—SiO2 at low temperature," Proceedings—Electrochemical Society, 2003, vol. 19, pp. 239-247.

Matsuzawa et al., "Room-temperature interconnection of electroplated Au microbump by means of surface activated bonding method," Electornic Components and Technology Conference, 2001, 51st Proceedings, IEEE, pp. 384-387.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

(56) References Cited

OTHER PUBLICATIONS

Norton, Francis, "Permeation of gases through solids," Journal of Applied Physics, Jan. 1957, vol. 28, No. 1.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature, in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Transducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers, '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump-Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Zhang et al., "Antenna-on-Chip and Antenna-in-Package Solutions to Highly Integrated Millimeter—Wave Devices for Wireless Communications", IEEE Transactions on Antennas and Propagation, 57(10):2830-2841, Oct. 2009.
Zhou et al., "A Wideband Circularly Polarized Patch Antenna for 60 GHz Wireless Communications", Wireless Engineering and Technology, 3:97-105, 2012.
Zoschke, K. et al., "Hermetic wafer level packaging of MEMS components using through silicon via and wafer to wafer bonding technologies," 2013 Electronic Components & Technology Conference, 2013 IEEE, pp. 1500-1507.
"The Advantages of Integrated MEMS to Enable the Internet of Moving Things", mCube, White Paper Jan. 2018.
Ceramic Microstructures: Control at the Atomic Level, Recent Progress in Surface Activated Bonding, 1998, pp. 385-389.
Bush, Steve, "Electronica: Automotive power modules from on Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article");

(56) References Cited

OTHER PUBLICATIONS however, the imaged part and the part shown in the BUSH article share the part No. "ONSEMI AR0820.".

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

Android Wiki, "Samsung Galaxy S2," indicating that the Samsung Galaxy S2 was unveiled on Feb. 13, 2011 at the Mobile World Congress (MWC) in Barcelona, https://android.fandom.com/wiki/Samsung_Galaxy_S2 (downloaded Nov. 20, 2023).

Gadgets360, "Sony Xperia S," indicating that the Sony Xperia LT26i product was released on Feb. 12, 2012, https://www.gadgets360.com/sony-xperia-s-609 (downloaded Nov. 20, 2023).

Michailos, Jean, "Future landscape for 3D Integration: from Interposers to 3D High Density," 3d ASIP—Dec. 13-15, 2016, San Francisco Airport, USA, 46 pages.

Omnivision OV20880 image, cross section of Omnivision product labeled OV20880, showing a hybrid bonded back side illuminated CMOS image sensor device with a pad opening to expose an aluminum bond pad. The part in the image was received on Sep. 24, 2021. Applicant makes no representation that the part in the image is identical to the part identified in the separately submitted reference Omnivision Technologies, Inc. in PR Newswire ("PR Newswire article"); however the imaged part and the part shown in the PR Newsire article share the part name "OV20880."

OmniVision Technologies, Inc., "OmniVision Announces New Family of 20-Megapixel PureCel®Plus-S Sensors for High-End Smartphones," PR Newswire, https://www.prnewswire.com/news-releases/omnivision-announces-new-family-of-20-megapixel-purecelplus-s-sensors-for-high-end-smartphones-300358733.html (dated Nov. 7, 2016; downloaded Nov. 20, 2023).

Samsung S5K3H2YX03 image, cross section of a back side illuminated CMOS image sensor (CIS) product, taken from Samsung Galaxy S2 phone. The part in the image was shipped on Nov. 25, 2011. The cross section shows tungsten and aluminum lining a trench formed in the back side of the sensor connecting a wire bond with a contact in the image sensor. The second image is a top-down view showing the wire bond pad and the trench that are depicted in the cross section. Applicant makes no representation that the part in the images is identical to image sensor products in the Galaxy S2 product identified in the separately submitted Android Wiki reference https://android.fandom.com/wiki/Samsung_Galaxy_S2 ("Android Wiki article"); however, the imaged sensor was obtained from a product named "Galaxy S2."

Sony Xperia LT26i Sensor image, cross-section of a front side illuminated CMOS image sensor obtained from a Sony Xperia LT26i phone. The part in the image was received on Mar. 29, 2012. The cross section shows a metal line connecting a solder bump at the back side to a contact at the front side of the sensor, with non-conductive epoxy covering the metal. The second image is a bottom-up view of the image sensor. The third image is a bottom-up closeup view showing the edge of the sensor, with the solder bumps and metal line of the cross-section visible. Applicant makes no representation that the part in the images is identical to image sensor products in the Sony Xperia LT26i product identified in the separately submitted Gadgets360 reference https://www.gadgets360.com/sony-xperia-s-609 ("Gadgets360 article"); however, the imaged sensor was obtained from a product named "Sony Xperia LT26i."

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

\* cited by examiner

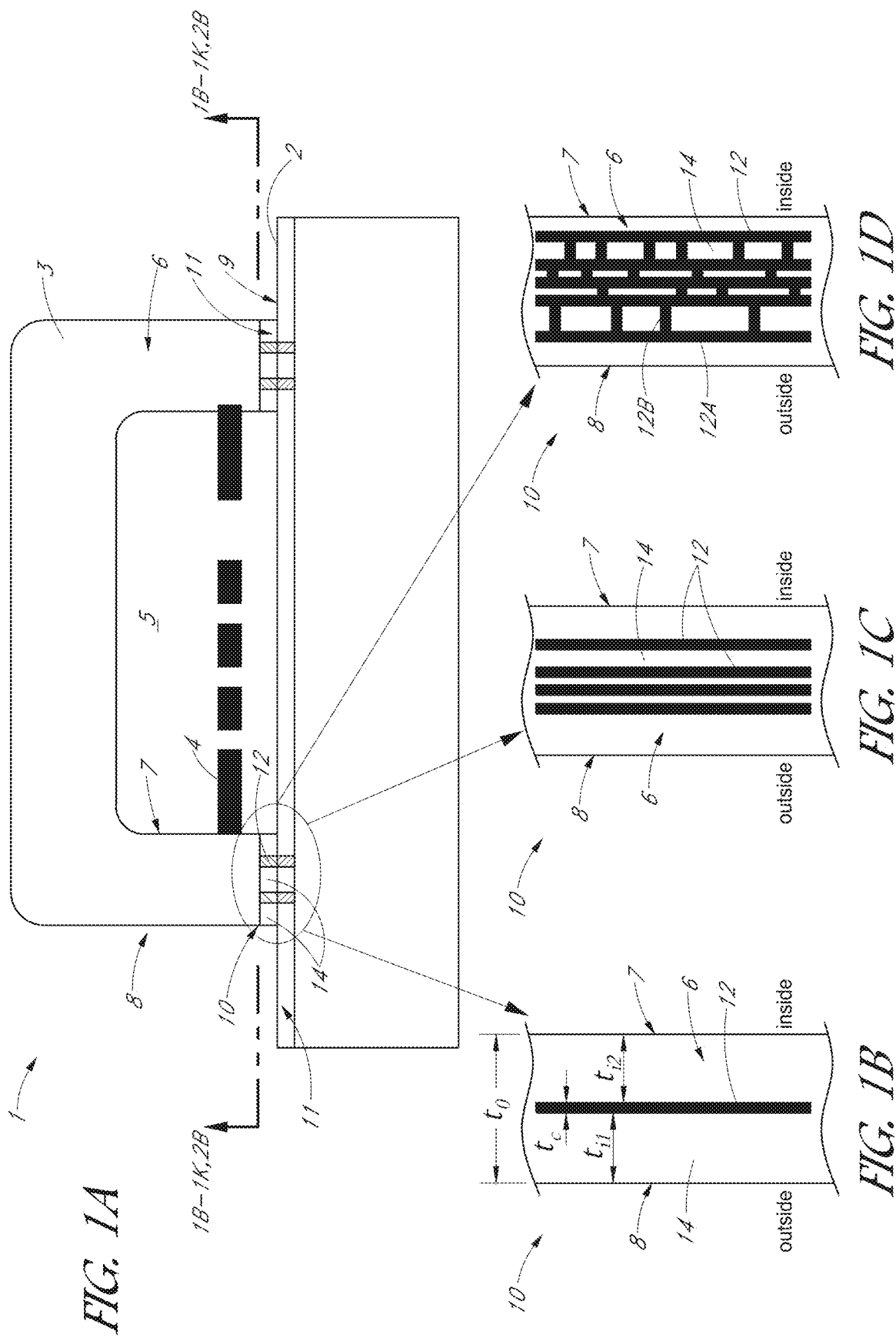

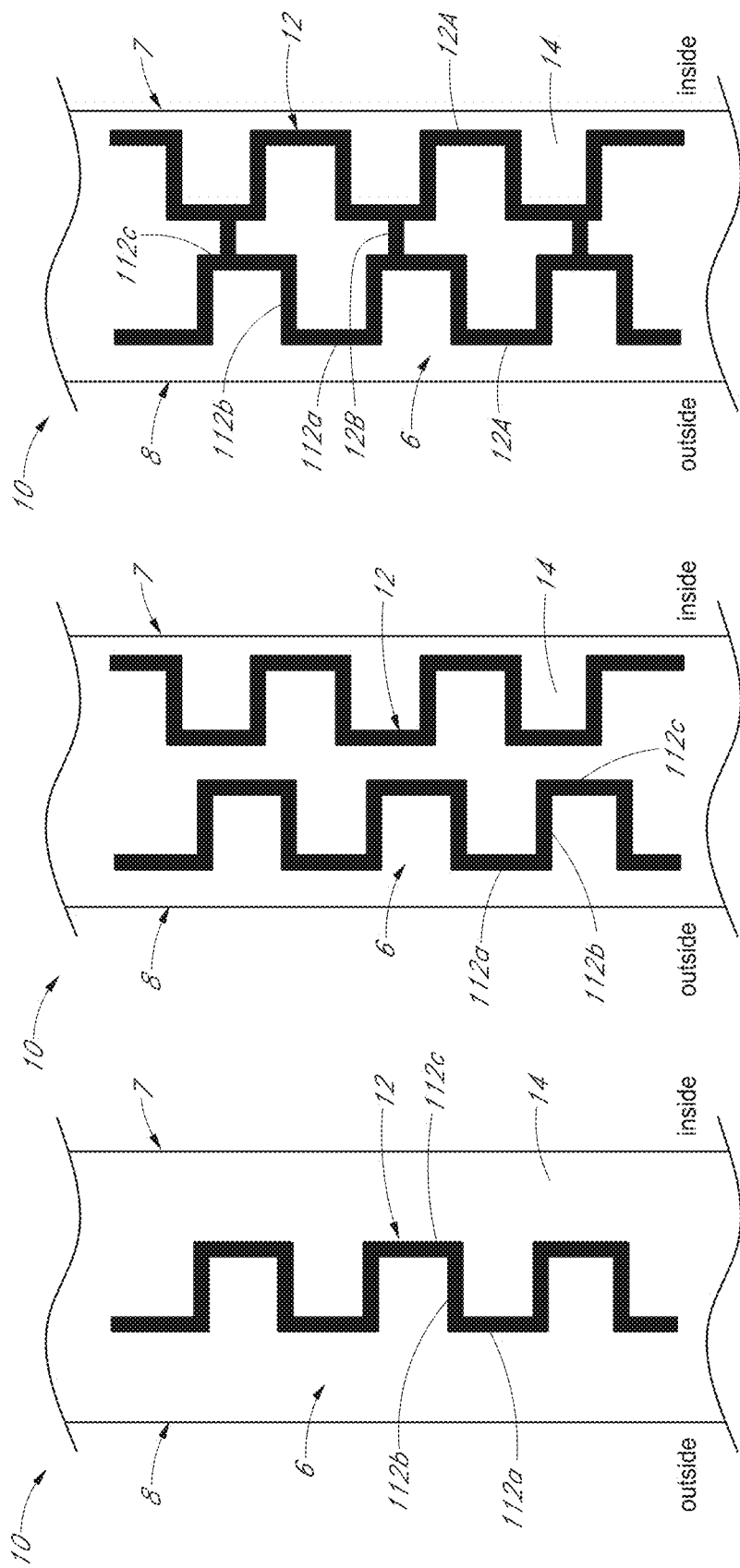

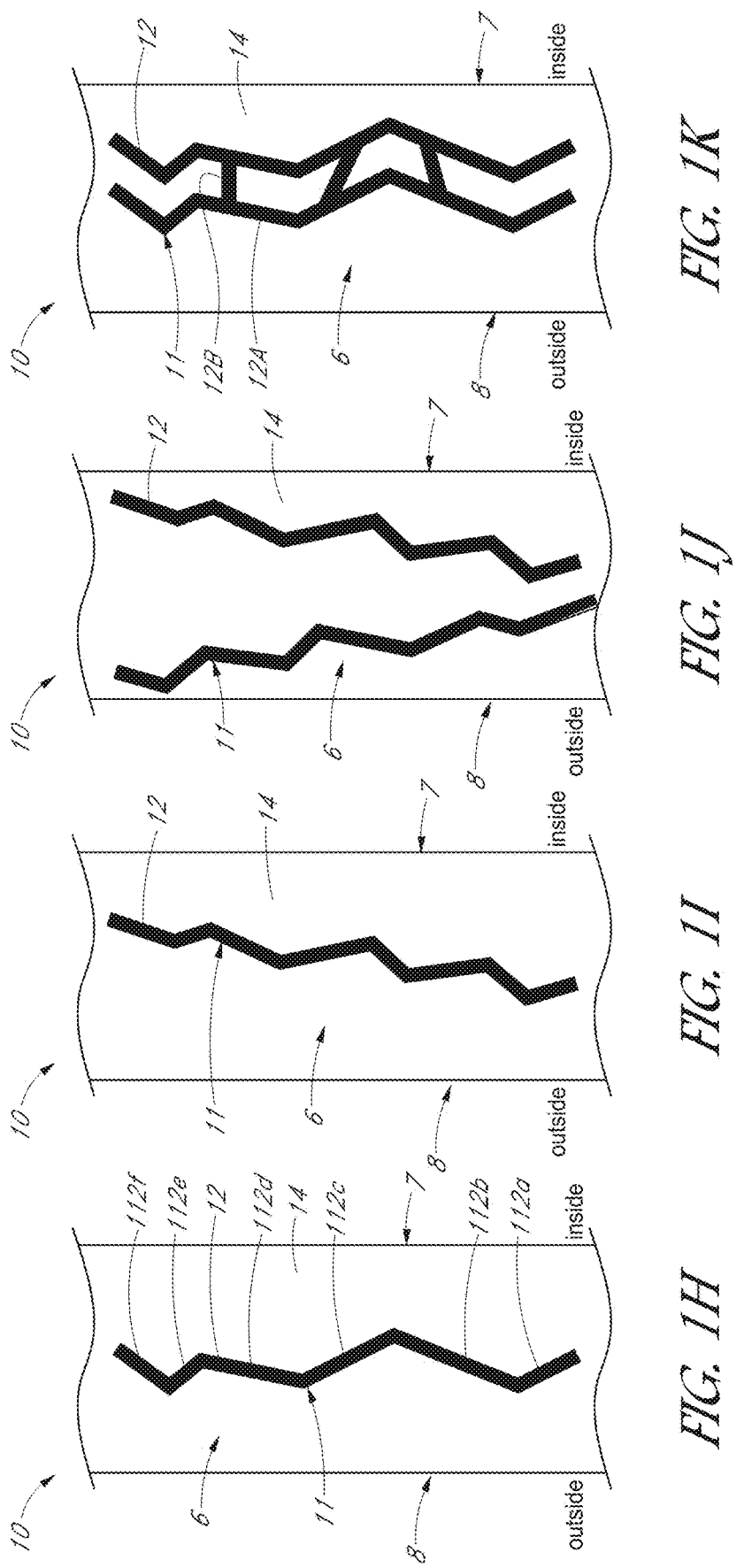

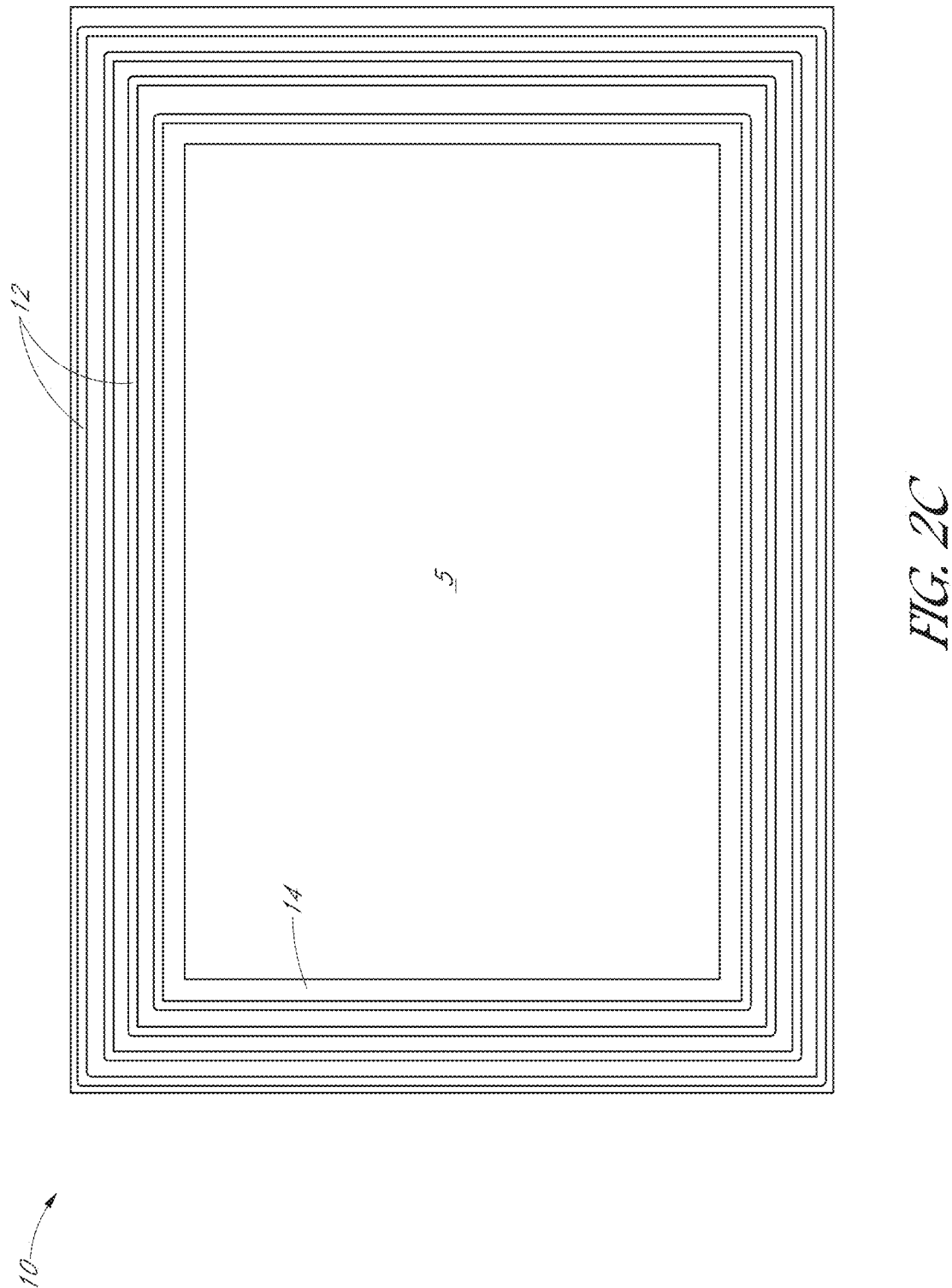

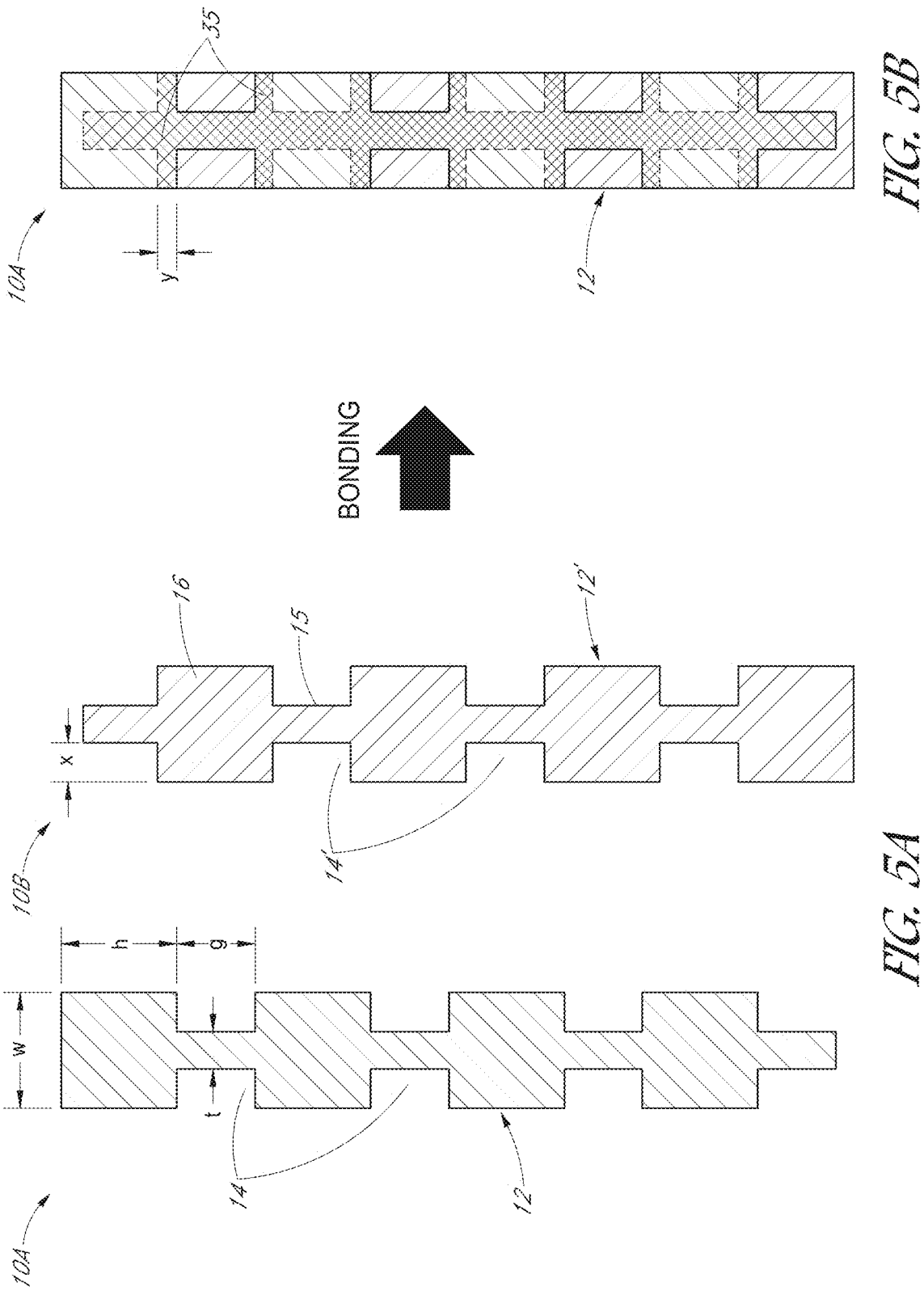

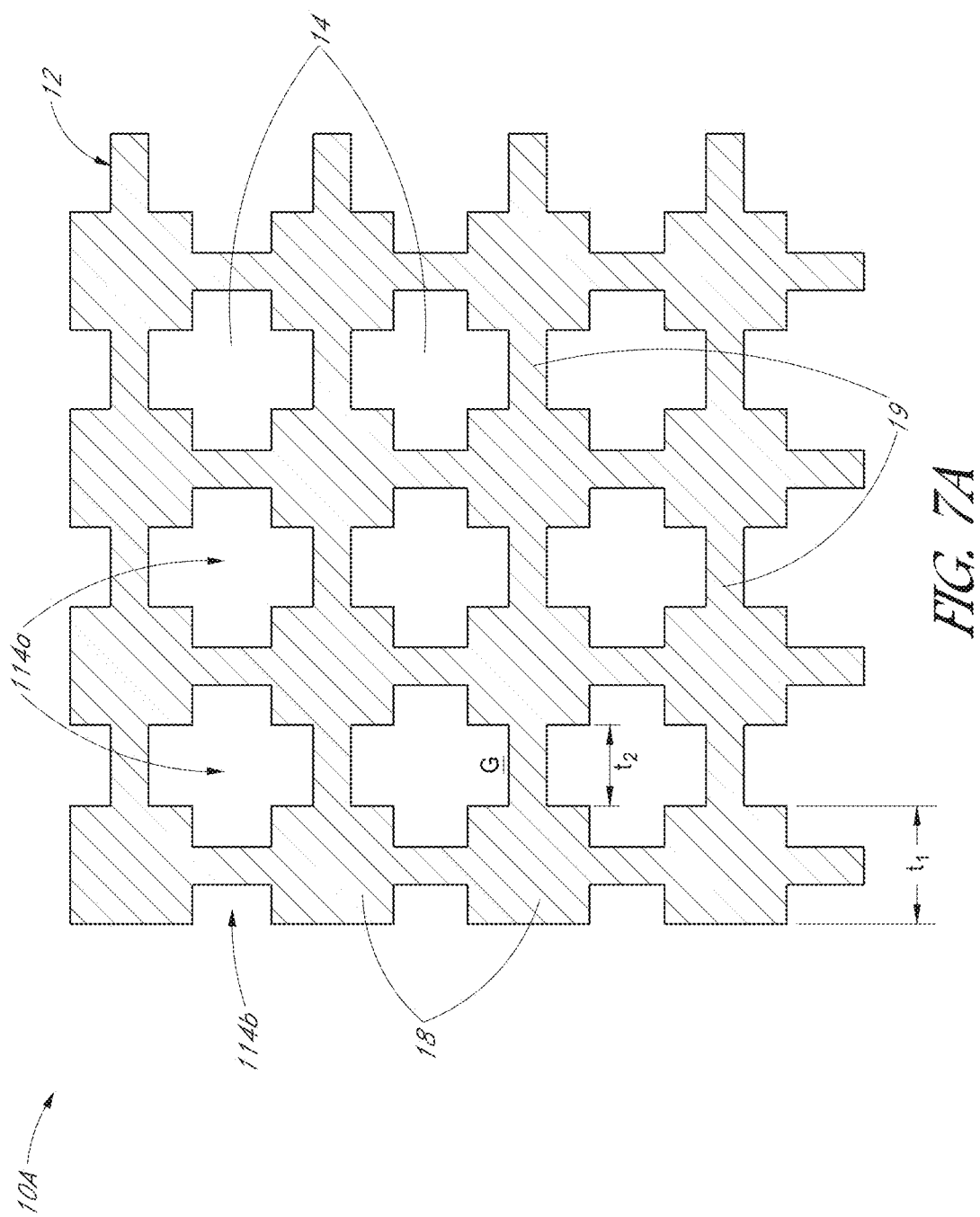

BONDED STRUCTURES

CROSS-REFERENCE TO RELATED APPLICATIONS

This application is a continuation of application Ser. No. 17/131,588, filed on Dec. 22, 2020, now U.S. Pat. No. 11,670,615, which is a continuation of application Ser. No. 16/724,017, filed Dec. 20, 2019, titled "BONDED STRUCTURES," now U.S. Pat. No. 10,879,207, which is a continuation of application Ser. No. 15/979,312, filed May 14, 2018, titled "BONDED STRUCTURES," now U.S. Pat. No. 10,546,832, which is a continuation of application Ser. No. 15/387,385, filed Dec. 21, 2016, titled "BONDED STRUCTURES," now U.S. Pat. No. 10,002,844, issued Jun. 19, 2018, the entire contents of which are incorporated herein by reference.

BACKGROUND

Field

The field generally relates to bonded structures, and in particular, to bonded structures that provide improved sealing between two elements (e.g., two semiconductor elements).

Description of the Related Art

In semiconductor device fabrication and packaging, some integrated devices are sealed from the outside environs in order to, e.g., reduce contamination or prevent damage to the integrated device. For example, some microelectromechanical systems (MEMS) devices include a cavity defined by a cap attached to a substrate with an adhesive such as solder. However, some adhesives may be permeable to gases, such that the gases can, over time, pass through the adhesive and into the cavity. Moisture or some gases, such as hydrogen or oxygen gas, can damage sensitive integrated devices. Other adhesives, such as solder, create their own long term reliability issues. Accordingly, there remains a continued need for improved seals for integrated devices.

BRIEF DESCRIPTION OF THE DRAWINGS

FIG. 1A is a schematic side sectional view of a bonded structure, according to various embodiments.

FIGS. 1B-1K are partial schematic sectional plan views of various embodiments of an interface structure defined along a bonded interface of the bonded structure.

FIG. 2C is a schematic sectional plan view of the interface structure of FIG. 1C.

FIGS. 2H and 2I are schematic plan views of interface structures that comprise conductive interface features including an array of conductive dots or other discrete shapes, as viewed from the plan view.

FIGS. 5A-5D are schematic plan views of an interface structure that increases tolerance for misalignments when corresponding interface features on each semiconductor element are bonded together.

FIG. 7A is a schematic plan view of a conductive interface feature in which a plurality of inner regions of non-conductive interface features are disposed within a crosswise grid structure defined by intersecting conductive interface features.

DETAILED DESCRIPTION

Various embodiments disclosed herein relate to interface structures that connect two elements (which may comprise semiconductor elements) in a manner that effectively seals integrated devices of the semiconductor elements from the outside environs. For example, in some embodiments, a bonded structure can comprise a plurality of semiconductor elements bonded to one another along an interface structure. An integrated device can be coupled to or formed with a semiconductor element. For example, in some embodiments, the bonded structure can comprise a microelectromechanical systems (MEMS) device in which a cap (a first semiconductor element) is bonded to a carrier (a second semiconductor element). A MEMS element (the integrated device) can be disposed in a cavity defined at least in part by the cap and the carrier.

In some arrangements, the interface structure can comprise one or more conductive interface features disposed about the integrated device, and one or more non-conductive interface features to connect the first and semiconductor elements and to define an effectively annular or effectively closed profile. In some embodiments, the interface structure can comprise a first conductive interface feature, a second conductive interface feature, and a solid state non-conductive interface feature disposed between the first and second conductive interface features. In some embodiments, each semiconductor element can comprise an associated conductive interface feature, and the conductive interface features can be directly bonded to one another to connect the two semiconductor elements.

Figure 2A:
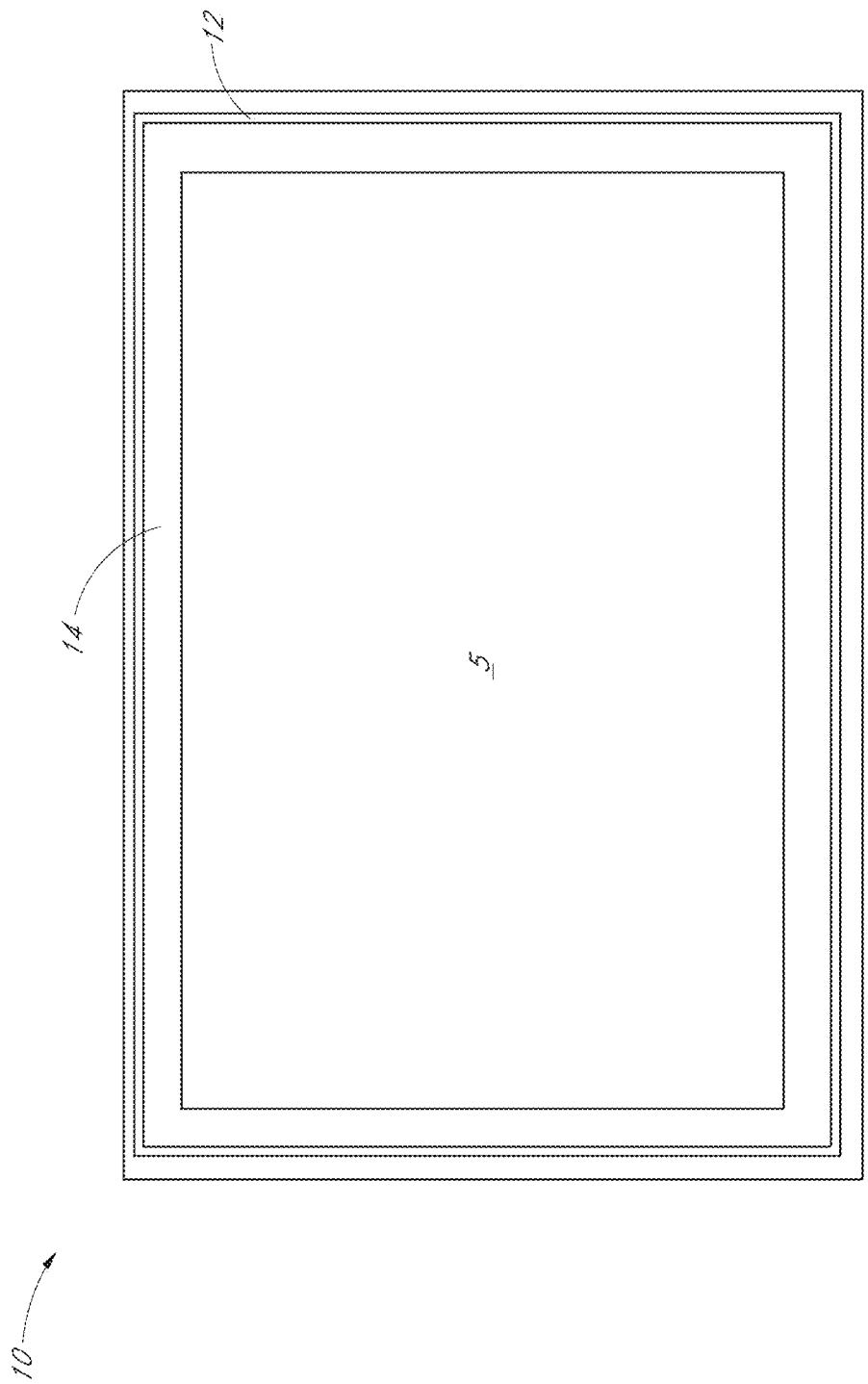
FIG. 2A is a schematic sectional plan view of an interface structure of the bonded structure shown in FIGS. 1A-1B.

FIG. 1A is a schematic side sectional view of a bonded structure 1, according to various embodiments. FIG. 2A is a schematic sectional plan view of an interface structure 10 of the bonded structure 1 shown in FIGS. 1A-1B. The bonded structure 1 can include a first semiconductor element 3 bonded to a second semiconductor element 2 along the interface structure 10. As explained herein, corresponding bonding layers 11 of the first and second semiconductor elements 3, 2 can be directly bonded to one another without an intervening adhesive. As explained below, the interface structure 10 can include conductive interface features 12 embedded in a surrounding non-conductive interface feature 14. As explained herein, the bonding layers 11 of each element 3, 2 can include conductive and non-conductive interface features that can bond to define a seal. As shown in FIG. 1A, the interface features 12, 14 can extend vertically into the semiconductor elements (e.g., into the bonding layers 11), such that the interface features 12, 14 can extend in a direction from one semiconductor element towards the other semiconductor element, e.g., vertically relative to the bonded structure. The first and second semiconductor elements can define a cavity 5 in which an integrated device 4 is at least partially disposed. In the illustrated embodiment, the first semiconductor element 3 can comprise a cap that is shaped to define the cavity, or that is disposed over a cavity in the second semiconductor element 2. For example, the semiconductor element 3 can comprise a wall 6 disposed about the integrated device 4 and separating the cavity 5 from the outside environs. In various embodiments, the wall 6 and cap can comprise a semiconductor material, such as silicon. In other embodiments, the wall 6 and cap can comprise a polymer, ceramic, glass, or other suitable material. The cavity 5 can comprise an air cavity, or can be filled with a suitable filler material. Although the first and second elements 2, 3 are described herein as semiconductor elements, in other embodiments, the first and second elements 2, 3 can comprise any other suitable type of element, which may or may not comprise a semiconductor material. For example, the elements 2, 3 can comprise various types of optical devices in some embodiments that may not comprise a semiconductor material.

The second semiconductor element 2 can comprise a carrier having an exterior surface 9 to which the first semiconductor element 3 is bonded. In some embodiments, the carrier can comprise a substrate, such as a semiconductor substrate (e.g., a silicon interposer with conductive interconnects), a printed circuit board (PCB), a ceramic substrate, a glass substrate, or any other suitable carrier. In such embodiments, the carrier can transfer signals between the integrated device 4 and a larger packaging structure or electronic system (not shown). In some embodiments, the carrier can comprise an integrated device die, such as a processor die configured to process signals transduced by the integrated device 4. In the illustrated embodiment, the integrated device 4 comprises a MEMS element, such as a MEMS switch, an accelerometer, a gyroscope, etc. The integrated device 4 can be coupled to or formed with the first semiconductor element 3 or the second semiconductor element 2.

In some configurations, it can be important to isolate or separate the integrated device die 4 from the outside environs, e.g., from exposure to gases and/or contaminants. For example, for some integrated devices, exposure to moisture or gases (such as hydrogen or oxygen gas) can damage the integrated device 4 or other components. Accordingly, it can be important to provide an interface structure 10 that effectively or substantially seals (e.g., hermetically or near-hermetically seals) the cavity 5 and the integrated device 4 from gases. As shown in FIGS. 1A and 2A, the interface structure 10 can be arranged to prevent gases from passing through the interface structure 10 from an outer surface 8 of the structure 1 to an inner surface 7 of the structure 1.

The disclosed embodiments can utilize materials that have low gas permeation rates and can arrange the materials so as to reduce or eliminate the entry of gases into the cavity 5. For example, the permeation rate of some gases (such as hydrogen gas) through metals may be significantly less that the permeation rate of gases through other materials (such as dielectric materials or polymers). Hydrogen gas, for example, may dissociate into its component atoms at or near the outer surface 8. The dissociated atoms may diffuse through the wall 6 or interface structure 10 and recombine at or near the inner surface 7. The diffusion rate of hydrogen gas through metal can be approximately proportional to the square root of the pressure. Other gases, such as rare gases, may not permeate metals at all. By way of comparison, gases may pass through polymer or glass (silicon oxide) materials faster (e.g., proportional to the pressure) since the gas molecules may pass through without dissociating into atoms at the outer wall 8.

Accordingly, the embodiments disclosed herein can beneficially employ metal that defines an effectively annular or closed pattern (see FIGS. 2A-2E) about the integrated device 4 to seal an interior region of the bonded structure (e.g., the cavity 5 and/or integrated device 4) from the outside environs and harmful gases. Beneficially, in some embodiments, the metal pattern can comprise a completely closed loop around the integrated device 4, which may improve sealing relative to other arrangements. In some embodiments, the metal pattern can comprise an incompletely annular pattern, e.g., mostly or partially annular, about the device 4, such that there may be one or more gaps in the metal. Since the permeation rate of gases through metals (such as copper) is less than the permeation rate of gases through dielectric or non-conductive materials (such as silicon oxide, silicon nitride, etc.), the interface structure 10 can provide an improved seal for an interior region of the bonded structure 1.

However, in some embodiments, it may be undesirable to utilize an interface structure 10 that includes only metal or a significant width of metal lines. If the interface structure 10 includes wide metal lines or patterns, then the metal may experience significant dishing during chemical mechanical polishing (CMP) or other processing steps. Dishing of the metal lines can adversely affect ability to bond the metal lines of first semiconductor element 3 to the second semiconductor element 2, particularly when employing direct metal-to-metal bonding techniques. Accordingly, in various embodiments, the interface structure 10 can include one or more conductive interface features 12 embedded with or otherwise adjacent to one or more non-conductive interface features 14. The conductive interface features can provide an effective barrier so as to prevent or reduce the permeation of gases into the cavity 5 and/or to the integrated device 4. Moreover, the conductive interface features can be made sufficiently thin and can be interspersed or embedded with the non-conductive interface features so as to reduce or eliminate the deleterious effects of dishing.

In some embodiments disclosed herein, the interface structure 10 can be defined by first interface features on the first semiconductor element and second interface features on the second semiconductor element. The first interface features (including conductive and non-conductive features) can be bonded to the corresponding second interface features to define the interface structure 10. In some embodiments, the interface structure 10 can comprise a separate structure that is separately bonded to the first semiconductor element 3 and the second semiconductor element 2. For example, in some embodiments, the wall 6 may be provided as a separate open frame with a generally planar semiconductor element 3 provided facing the frame. A second interface structure (not shown) can comprise an intervening structure that is directly bonded without an intervening adhesive between the open frame and semiconductor element 3 thereby forming a similar enclosed cavity 5 to that shown in FIG. 1A. The interface structure(s) 10 may provide mechanical and/or electrical connection between the first and second semiconductor elements 3, 2. In some embodiments, the interface structure 10 may provide only a mechanical connection between the elements 3, 2, which can act to seal the cavity 5 and/or the integrated device 4 from the outside environs. In other embodiments, the interface structure 10 may also provide an electrical connection between the elements 3, 2 for, e.g., grounding and/or for the transmission of electrical signals. As explained in more detail below in connection with FIGS. 4A-7C, the conductive interface features can be direct bonded to one another without an intervening adhesive and without application of pressure or a voltage. For example, bonding surfaces (e.g., bonding layers 11) of first and second interface features can be prepared. The bonding surfaces can be polished or planarized, activated, and terminated with a suitable species. For example, in various embodiments, the bonding surfaces can be polished to a root-mean-square (rms) surface roughness of less than 1 nm, e.g., less than 0.5 nm. The polished bonding surfaces can be activated by a slight etch or plasma termination. In various embodiments, the bonding surfaces can terminated with nitrogen, for example, by way of etching using a nitrogen-containing solution or by using a plasma etch with nitrogen. As explained herein, the bonding surfaces can be brought into contact to form a direct bond without application of pressure. In some embodiments, the semiconductor elements 3, 2 can be heated to strengthen the bond, for example, a bond between the conductive features. Additional details of direct bonding methods may be found at least in U.S. Pat. Nos. 9,385,024; 9,391,143; and 9,431,368, the entire contents of which are incorporated by reference herein in their entirety and for all purposes. In some embodiments, the conductive interface features of both elements 3, 2 and the non-conductive interface features of both elements 3, 2 are simultaneously directly bonded to one another.

It should be appreciated that, although the illustrated embodiment is directed to a MEMS bonded structure, any suitable type of integrated device or structure can be used in conjunction with the disclosed embodiments. For example, in some embodiments, the first and second semiconductor elements can comprise integrated device dies, e.g., processor dies and/or memory dies. In addition, although the disclosed embodiment includes the cavity 5, in other arrangements, there may not be a cavity. For example, the embodiments disclosed herein can be utilized with any suitable integrated device or integrated device die in which it may be desirable to seal active components from the outside environs and gases. Moreover, the disclosed embodiments can be used to accomplish other objectives. For example, in some arrangements, the disclosed interface structure 10 can be used to provide an electromagnetic shield to reduce or prevent unwanted electromagnetic radiation from entering the structure 1, and/or to prevent various types of signal leakage. Of course, the cavity may be filled with any suitable fluid, such as a liquid, gas, or other suitable substance which may improve the thermal, electrical or mechanical characteristics of the structure 1.

FIGS. 1B-1K are schematic, partial, sectional plan views of various embodiments of the interface structure 10. It will be understood that the illustrated patterns can extend completely annularly or incompletely annularly (e.g., mostly annularly), around the protected region, such as the cavity 5 of FIG. 1A, to define an effectively annular or effectively closed profile. As used herein, effectively annular structures may include round annular structures, as well as non-rounded annular structures that define an effectively closed profile (e.g., square or other polygon). As shown in FIGS. 1B-1K, the interface structure 10 can comprise one or a plurality of conductive interface features 12 and one or a plurality of non-conductive interface features 14. As shown in FIG. 1A, the conductive and non-conductive features 12, 14 can extend vertically through portions of the first and/or second semiconductor elements 3, 2, e.g., vertically through portions of the bonding layer 11. For example, the conductive and non-conductive features 12, 14 can extend vertically through the first and/or second semiconductor elements 3, 2 (e.g., in a direction non-parallel or perpendicular to the major surface of the semiconductor elements 3, 2) by a vertical distance of at least 0.05 microns, at least 0.1 microns, at least 0.5 microns, or at least 1 micron. For example, the conductive and non-conductive features 12, 14 can extend vertically through the first and/or second semiconductor elements 3, 2 by a vertical distance in a range of 0.05 microns to 5 microns, in a range of 0.05 microns to 4 microns, in a range of 0.05 microns to 2 microns, or in a range of 0.1 microns to 5 microns. By extending the conductive and non-conductive features 12, 14 through portions of the first and/or second semiconductor elements 3, 2, the conductive and non-conductive features 12, 14 can provide a seal without gaps between the semiconductor elements 3, 2 and the interface structure 10. The conductive and non-conductive features 12, 14 provided on semiconductor elements 3, 2 may provide generally planar surfaces for bonding the two semiconductor elements.

The conductive interface feature 12 can comprise any suitable conductor, such as a metal. For example, the conductive interface feature 12 can comprise copper, aluminum, or any other suitable metal that is sufficiently impermeable to fluids/gases, such as air, hydrogen, nitrogen, water, moisture, etc. The non-conductive interface feature 14 can comprise any suitable non-conductive material, such as a dielectric or semiconductor material. For example, the non-conducive interface feature 14 can comprise silicon oxide in some embodiments. Beneficially, the use of both a conductive interface feature 12 and a non-conductive interface feature 14 can provide improved sealing to prevent gases from passing from the outside environs into the cavity 5 and/or to the device 4. As explained above, conductors such as metals may generally provide improved sealing for many gases. However, some non-conductive materials (e.g., dielectrics) may be less permeable to certain gases than conductors, metals, or semiconductors. Structurally mixing the conductive features 12 with the non-conductive features 14 may provide a robust seal to prevent many different types of gases and other fluids from entering the cavity and/or affecting the device 4.

In the embodiment of FIG. 1B, only one conductive interface feature 12, which may be completely annular, is provided. The conductive interface feature 12 can be embedded in one or more non-conductive interface features 14 to define an effectively annular or effectively closed profile. For example, in some embodiments, the conductive interface feature 12 can be embedded in a bulk non-conductive material. In other embodiments, layers of non-conductive material can be provided on opposing sides of the conductive interface feature 12. As shown in FIG. 2A, the conductive interface feature 12 can extend around the cavity 5 and/or the integrated device 4 in a completely annular pattern. In FIG. 2A, for example, the conductive interface feature 12 extends in a complete annulus, or closed shape, about the cavity 5 and/or device 4, such that the non-conductive material of the non-conductive feature 14 does not cross or intersect the conductive interface feature 12. In other embodiments, however (for example, see description of FIGS. 2D and 2E below), there may be one or more gaps between portions of the conductive interface feature 12, but without a direct path to the cavity 5. Individual elements of the conductive interface feature 12 can be incompletely annular in some embodiments. For example, individual elements of the conductive interface feature 12 can be mostly annular, e.g., extend about the cavity 5 and/or the integrated device 4 by at least 180°, at least 270°, at least 350°, or at least 355° (e.g., 360°), while cooperating to define an effectively annular or closed interface structure 10. Further, as explained above, the conductive interface feature 12 can extend vertically into and can be embedded in portions of the wall 6 and/or corresponding portions of the second semiconductor element 2.

The structure of FIG. 1A, including any of the example patterns of FIGS. 1B-1K, can be formed, for example, by semiconductor fabrication techniques, such as by forming metal lines on a substrate by deposition, patterning and etching and depositing oxide thereover, or by damascene processing. Desirably, the metal lines to be bonded are formed flush with surrounding non-conductive material, or slightly (e.g., 0.5 nm to 20 nm) recessed or protruding from the non-conductive material. Annular or mostly annular patterns of metal lines can be formed on both semiconductor elements 3, 2 using semiconductor processing, for directly bonding to one another and creating an effective metal seal against gas diffusion.

The interface structure 10 can have an interface width $t_0$ in a range of 1 micron to 1 mm. The conductive interface feature 12 can have a conductor width $t_c$ in a range of 0.1 microns to 50 microns. The non-conductive interface feature 14 can have non-conductor widths $t_i$ in a range of 0.1 micron to 1 mm. As explained above, the interface structure 10 disclosed in FIG. 1B can beneficially provide an effective seal against gases entering the cavity 5 and/or interacting with the device 4. Moreover, the interface structure 10 disclosed herein can be thinner than other types of bonds or interfaces, which can advantageously reduce the overall package footprint.

Turning to FIG. 1C, the interface structure 10 can include a plurality of conductive interface features 12 and an intervening solid state (e.g., non-gaseous) non-conductive interface feature 14 disposed between adjacent conductive interface features 12. FIG. 2C is a schematic plan view of the interface structure 10 shown in FIG. 1C. As with the implementation of FIG. 1B, the interface structure 12 can be disposed about the integrated device 4 and can comprise conductive features 12 arranged in an effectively annular or closed profile (e.g., a complete or incomplete annulus in various arrangements) to connect the first semiconductor element 3 and the second semiconductor element 2. In FIGS. 1C and 2C, the conductive features 12 comprise at least one complete or absolute annulus. In other embodiments, the conductive features can be shaped differently, but can be arranged to define an effectively annular or closed profile. The use of multiple conductive features 12 can provide multiple layers of highly impermeable material so as to reduce the inflow of gases into the cavity 5. Utilizing multiple thin conductive features 12 spaced by the non-conductive features 14, compared to wider features, can reduce the effects of dishing due to polishing for a given degree of overall impermeability. Thus, in various embodiments, multiple conductive features 12 can be arranged around one another, for example concentrically, mostly or completely about the device 4 and/or the cavity 5 to provide an effective gas seal.

Moving to FIG. 1D, in some embodiments, the conductive interface features 12 can comprise a plurality of annular conductors 12A disposed about the cavity 5 and/or device 4 in an effectively annular or closed pattern, and a plurality of crosswise conductors 12B connecting adjacent annular conductors 12A. Advantageously, the use of annular and crosswise conductors 12A, 12B can provide increased contact area for implementations that utilize direct bonding (explained below), and can provide an improved gas seal due to the beneficial permeation properties of the conductive material. As with the embodiments of FIGS. 1B-1C, in FIG. 1D, the conductive interface features 12 can delimit a closed loop such that the non-conductive features 14 do not intersect or cross the conductive features 12.

FIGS. 1E-1G illustrate conductive interface features 12 having a kinked, annular profile, in which a plurality of conductive segments 112a-112c are connected end-to-end and angled relative to adjacent segments. As with the embodiments of FIGS. 1B-1D, the features 12 can be disposed about the cavity 5 and/or device 4 in an effectively annular or closed pattern, e.g., in a complete annulus. The kinked profiles illustrated in FIGS. 1E-1G can comprise a first segment 112a and a second segment 112c spaced apart from one another in a transverse direction. The first and second segments 112a, 112c can be connected by an intervening transverse segment 112b. The first and second segments 112a, 112c can be oriented along a direction generally parallel to the at least partially annular pathway around the cavity 5 and/or integrated device 4. The transverse segment 112c can be oriented transverse or non-parallel to the first and second segments 112a, 112c. In some embodiments, the non-conductive interface features 14 may not cross the conductive features 12.

The kinked annular profile of the conductive interface features 12 can facilitate direct bonding with increased tolerance for misalignment, as compared with features 12 that are straight or non-kinked, while maintaining the benefits of narrow lines with respect to the effects of dishing after polishing. The kinked profile can include any number of conductive interface features 12. For example, FIG. 1E illustrates a kinked profile with a single conductive interface feature 12. FIG. 1F illustrates a plurality of conductive interface features 12 spaced apart transversely by an intervening non-conductive interface feature 14. As with FIG. 1D, in FIG. 1G, spaced apart annular conductors 12A can be joined by crosswise conductors 12B. Skilled artisans would appreciate that other patterns may be suitable.

FIGS. 1H-1K illustrate conductive interface features 12 having an irregular or zigzag annular profile, in which a plurality of conductive segments 112a-112f are connected end-to-end and angled relative to adjacent segments by way of one or more bend regions 11. As shown in FIGS. 1H-1K, the segments 112a-112f may be arranged in an irregular pattern, in which the segments 112a-112f are angled at different orientations and/or have different lengths. In other arrangements, the segments 112a-112f may be arranged in a regular pattern at angles that are the same or periodic along the annular profile. In still other arrangements, the conductive features 12 can be curved or otherwise non-linear. These features may also increase tolerance for misalignment, relative to straight line segments, while still employing relatively narrow lines that are less susceptible to dishing and therefore earlier to employ in direct metal-to-metal bonding.

Figure 2B:
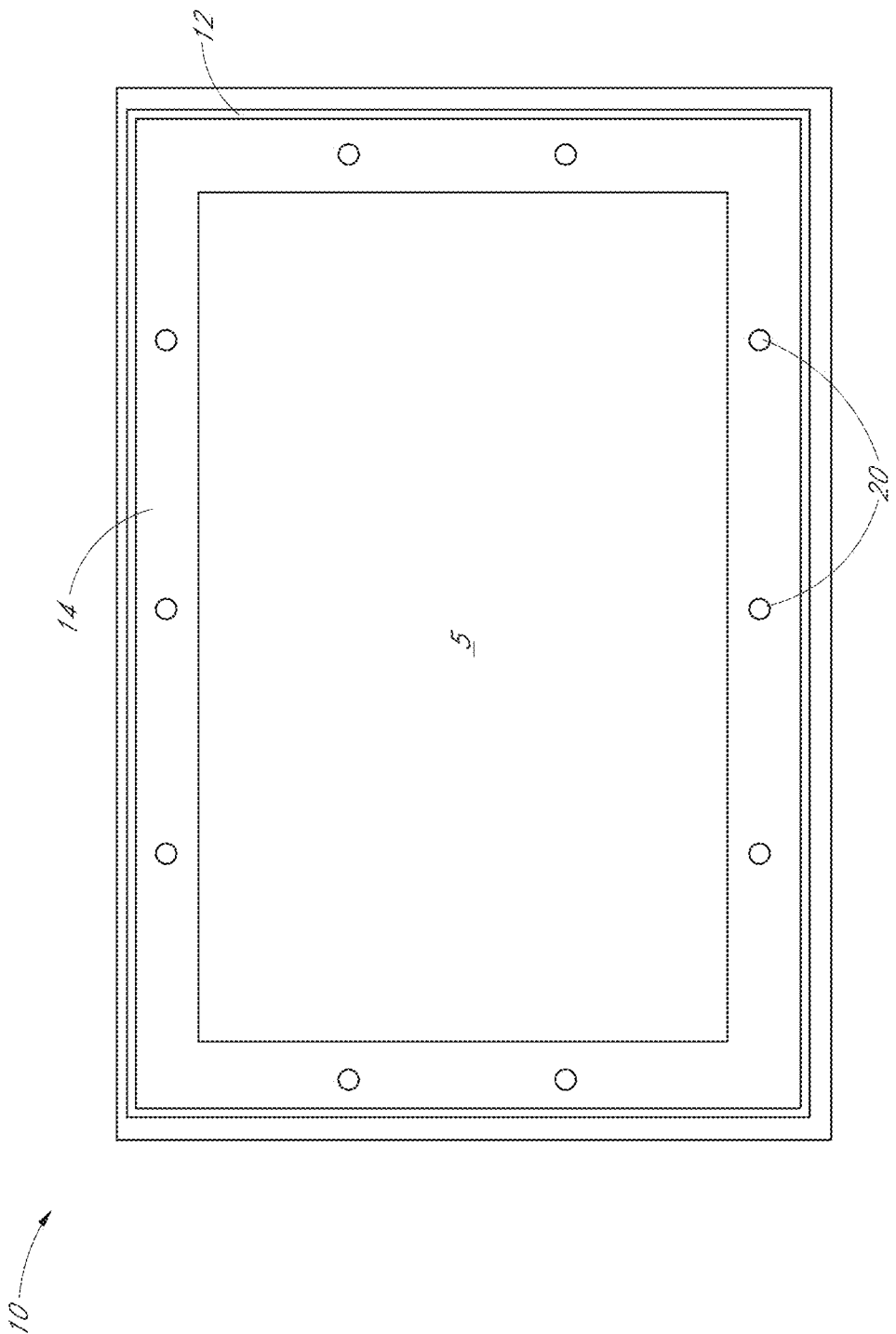
FIG. 2B is a schematic sectional plan view of an interface structure having one or more electrical interconnects extending through the bonded interface.

FIG. 2B is a schematic sectional plan view of an interface structure 10 having one or more electrical interconnects extending through the interface structure 10. As with FIG. 2A, the conductive feature(s) 12 can be disposed within the interface structure 10 about the cavity 5 and/or integrated device 4 to define an effectively annular or closed profile, e.g., a completely annular profile. The conductive feature(s) 12 can comprise elongate feature(s) with a length greater than a width (e.g., with a length of at least five times the width, or at least ten times the width). Unlike the interface structure 10 shown in FIG. 2A, however, the interface structure 10 of FIG. 2B includes one or a plurality of electrical interconnects 20 extending vertically through one or more non-conductive interface features 14. The electrical interconnect 20 can be in electrical communication with the integrated device 4 and/or other components of the bonded structure 1 so as to transfer signals between the various components of the structure 1. In some embodiments, the electrical interconnect 20 can extend from the first semiconductor element 3 to the second semiconductor element 2. As shown in FIG. 2B, the electrical interconnect 20 can be spaced inwardly and electrically separated from the conductive interface feature 12, which itself can also serve to electrically connect circuits in the first and second semiconductor elements 3, 2. In other embodiments, the electrical interconnect 20 can be spaced outwardly from the conductive interface feature 12. In still other embodiments, as explained below, the electrical interconnect 20 can extend through intervening non-conductive interface features 14 disposed between a plurality of conductive interface features 12.

The electrical interconnects 20 can provide electrical communication between the semiconductor elements 3, 2 through the interface structure 10. Providing the interconnects 20 in a direction non-parallel or transverse to the interface structure 10 can therefore enable the interface structure 10 to act as both a mechanical and electrical connection between the two semiconductor elements 3, 2. The interconnects 20 can comprise any suitable conductor, such as copper, gold, etc. The interconnects 20 can comprise conductive traces or through-silicon vias in various arrangements. Moreover, as noted above, the interface features 12 may also serve as annular or mostly annular electrical interconnects, with or without the conventional interconnects 20.

Figure 2D:
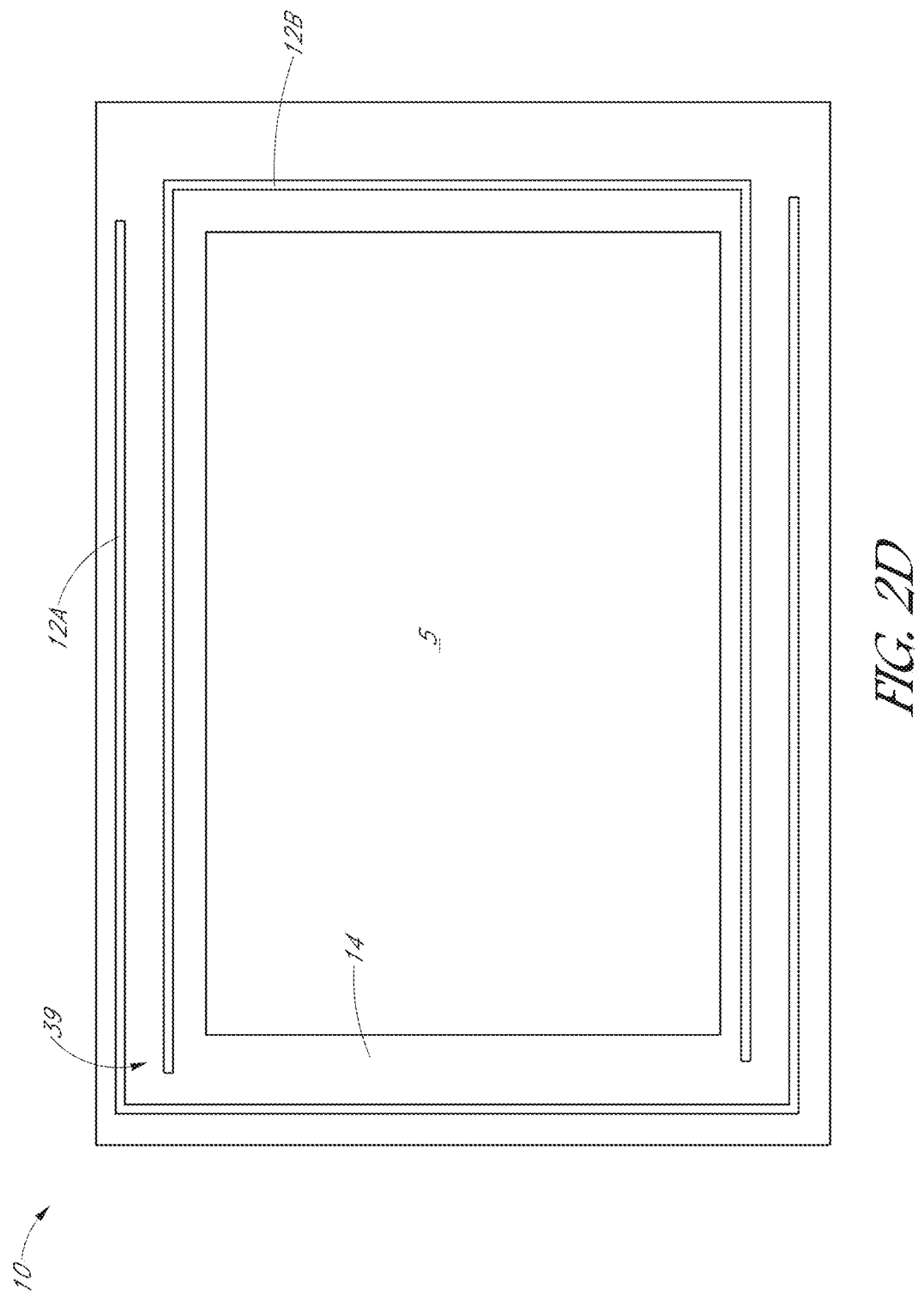
FIG. 2D is a schematic sectional plan view of an interface structure having a plurality of conductive interface features disposed about a cavity to define an effectively annular profile, with each conductive interface feature comprising a mostly annular profile.

FIG. 2D is a schematic sectional plan view of an interface structure 10 having a plurality of conductive interface features 12A, 12B disposed about a cavity 5 to define an effectively annular or closed profile, with each conductive interface feature 12A, 12B comprising an incompletely annular feature, e.g., a mostly annular feature extending more than 180°. For example, as shown in FIG. 2D, each conductive interface feature 12A, 12B can comprise a U-shaped structure, with the feature 12B disposed inwardly relative to the feature 12A by a non-conductive gap 39. Thus, in FIG. 2D, each conductive interface feature 12A, 12B may comprise a mostly annular profile, but with the gap 39 between the two interface features 12A, 12B such that any one of the interface features 12A, 12B does not necessarily define a closed loop. The structure 10 shown in FIG. 2D may still be effective at reducing the permeation of gases into cavity 5 and/or device 4, since the pattern of conductive interface features 12A, 12B combine to create an effectively annular or effectively closed structure about the cavity 5. Some gas may permeate through the gap 39, but the gas would have a very long path through the non-conductive material before it could reach the cavity 5 and/or contact the device 4, so as to overcome the higher diffusivity of gases in the non-conductive material 14 relative to the conductive material of the conductive interface features 12A, 12B. It should be appreciated that although two features 12A, 12B are shown herein, any suitable number of features 12 can be used.

Figure 2E:
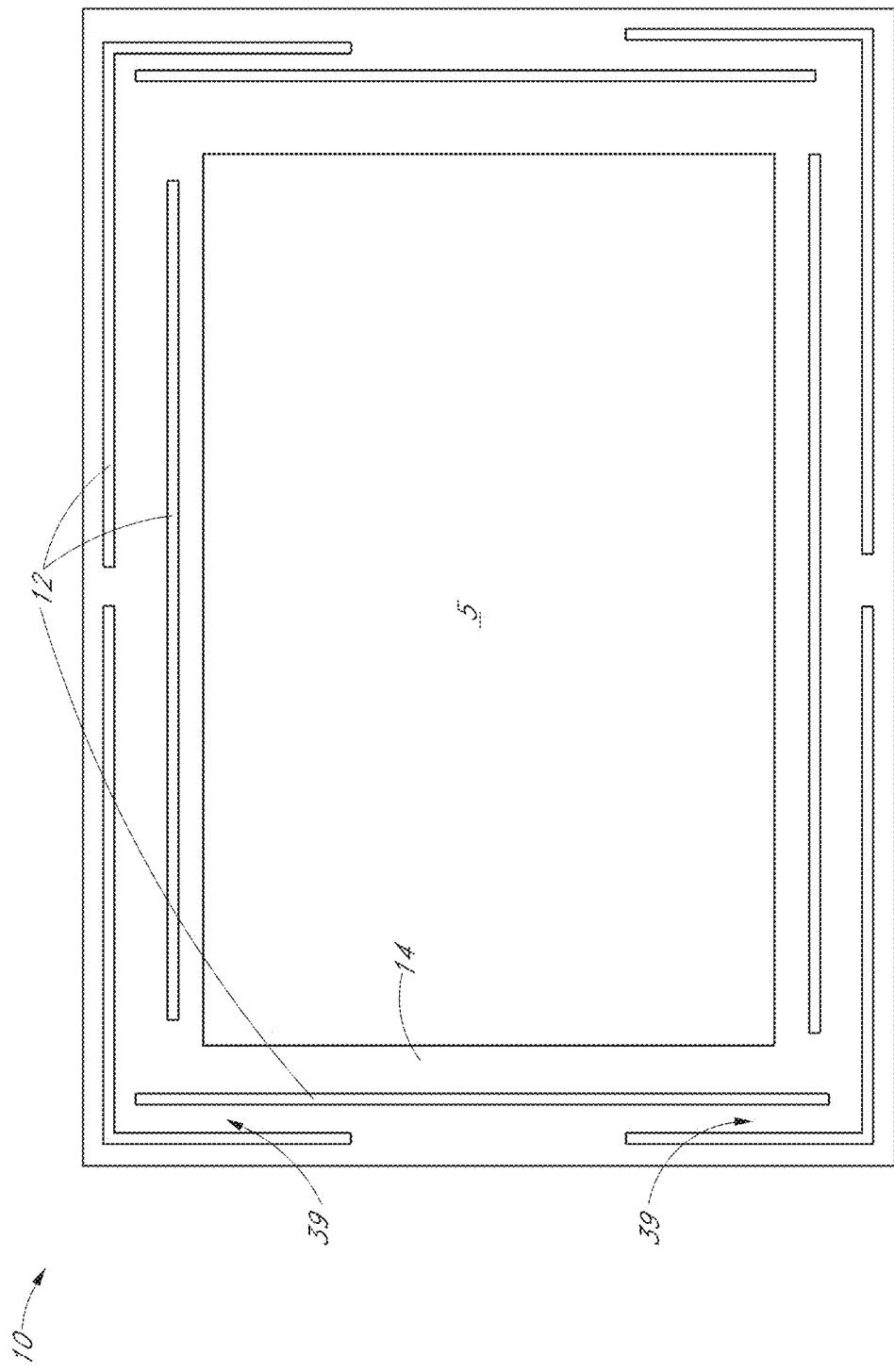
FIG. 2E is a schematic sectional plan view of an interface structure having a plurality of conductive interface features disposed about a cavity to define an effectively annular profile, wherein the plurality of conductive features comprises a plurality of segments spaced apart by gaps.

FIG. 2E is a schematic sectional plan view of an interface structure 10 having a plurality of conductive interface features 12 disposed about a cavity 5 to define an effectively annular or closed profile, wherein the plurality of conductive features 12 comprises a plurality of segments spaced apart by non-conductive gaps 39. The segments that define each conductive interface feature 12 shown in FIG. 2E comprise linear segments, but in other embodiments, the segments can be curved. In FIG. 2E, some or all conductive interface features 12 on their own may not define a mostly annular pattern. Taken together, however, the pattern defined by the illustrated arrangement of conductive interface features 12 may define an effectively annular or closed pattern. Thus, even though a particular conductive interface feature 12 may not be annular, the arrangement of multiple conductive interface features 12 can define an effectively annular or closed pattern to seal an interior region of the bonded structure from gas entering the interior region from the outside environs, as shown in FIG. 2E.

The embodiments of FIGS. 2A-2E can accordingly comprise interface structures 10 that include conductive and non-conductive interface features 12, 14 that collectively define an effectively annular or closed diffusion barrier. For example, a particular conductive interface feature 12 can comprise a complete annulus or an incomplete annulus (e.g., mostly annular) that is arranged with other conductive and non-conductive interface features so as to define an effectively annular pattern or diffusion barrier. In some embodiments, the conductive interface feature can comprise other shapes, such as straight or curved segments, that are arranged about the cavity 5 and/or device 4 so as to define an effectively annular pattern or diffusion barrier. Moreover, the embodiments of FIGS. 2D and 2E can advantageously provide multiple conductive segments that can each serve as separate electrical connections, for example, for separate signal line connections, ground line connections and power line connections. Together those segments can provide effectively annular conductive patterns to serve as diffusion barriers. The effectively annular patterns described herein can beneficially provide a longer distance over which gases travel to reach the sensitive components of the structure 1, which can reduce the permeability of the structure 1.

Figure 2F:
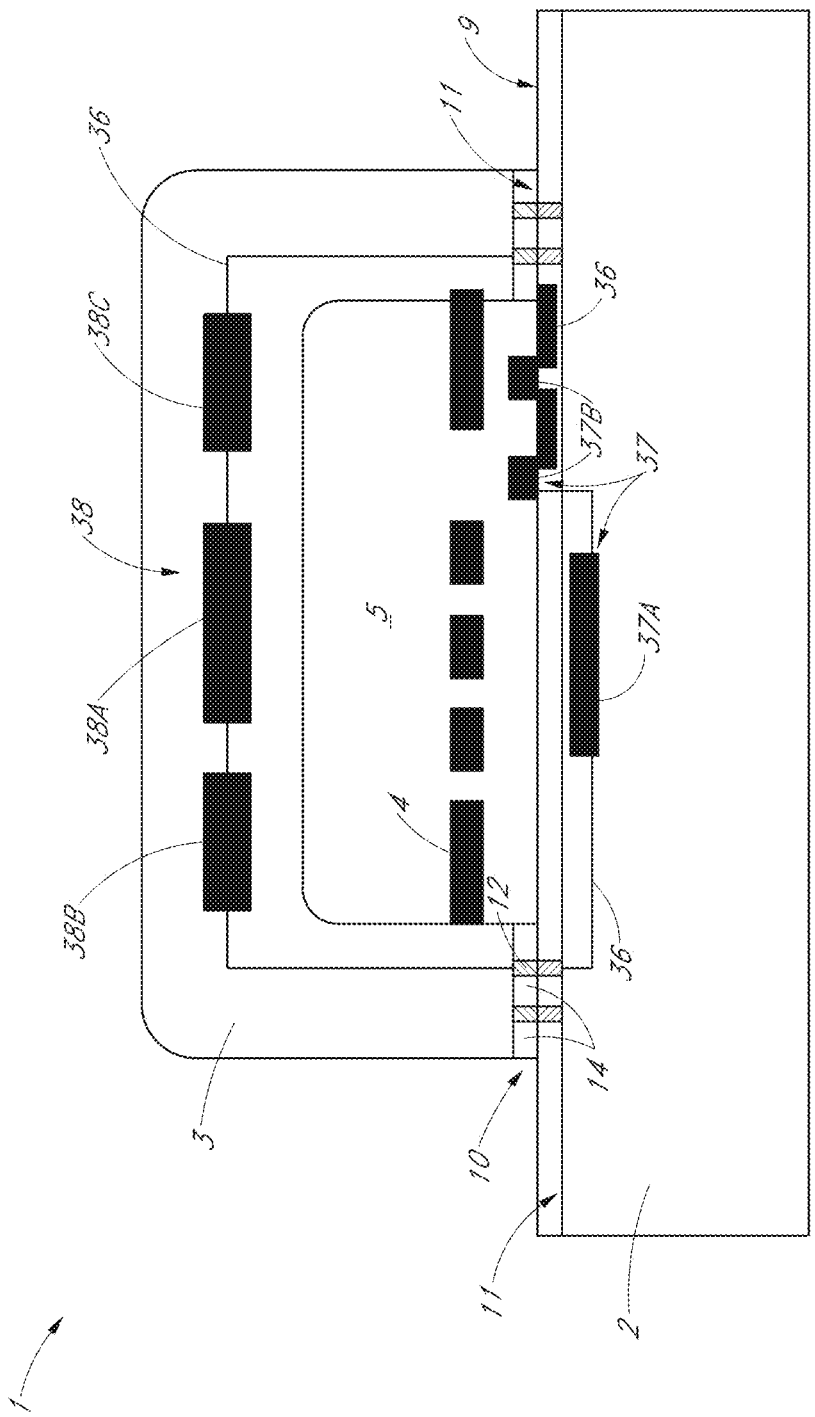
FIG. 2F is a schematic side sectional view of a bonded structure, according to some embodiments.

FIG. 2F is a schematic side sectional view of a bonded structure 1, according to some embodiments. FIG. 2F is similar to FIG. 1A, except in FIG. 2F, the first semiconductor element 3 can comprise one or a plurality of electronic components 38 formed or coupled with various portions of the semiconductor element 3. For example, as illustrated, the semiconductor element 3 can comprise a plurality of electronic components 38A-38C. The electronic components 38A-38C can comprise any suitable type of electronic component. The electronic components 38 can comprise any suitable type of device, such as integrated circuitry (e.g., one or more transistors) or the like. In some embodiments, the electronic components 38 can communicate with the device 4, the second semiconductor element 2, and/or other components by way of the interconnects (see FIG. 2B) and/or by the conductive interface features 12. For example, the electronic components 38 can communicate with the second semiconductor element 2 by way of one or more conductive traces 36 that pass through the semiconductor element 3. The electronic components 38 and the traces 36 can be defined by semiconductor processing techniques, such as deposition, lithography, etching, etc. and can be integrated with the semiconductor element 3. The traces, for example, may be formed by conventional back-end-of-line interconnect metallization through multiple metal levels. Moreover, as shown in FIG. 2F, any of the embodiments disclosed herein can include one or a plurality of electronic components 37 formed (e.g., with semiconductor processing techniques) or coupled with the second semiconductor element 2. The electronic components 37 can comprise any suitable type of device, such as integrated circuitry or the like, and can communicate with the device 4, the first semiconductor element 3, and/or other components. For example, in some embodiments, one or more electronic components 37A can be defined within the semiconductor element 2 (e.g., buried within the semiconductor element 2 or exposed at the surface 9). In some embodiments, one or more electronic components 37B can be defined at or on the surface 9 of the semiconductor element 2.

Figure 2G:
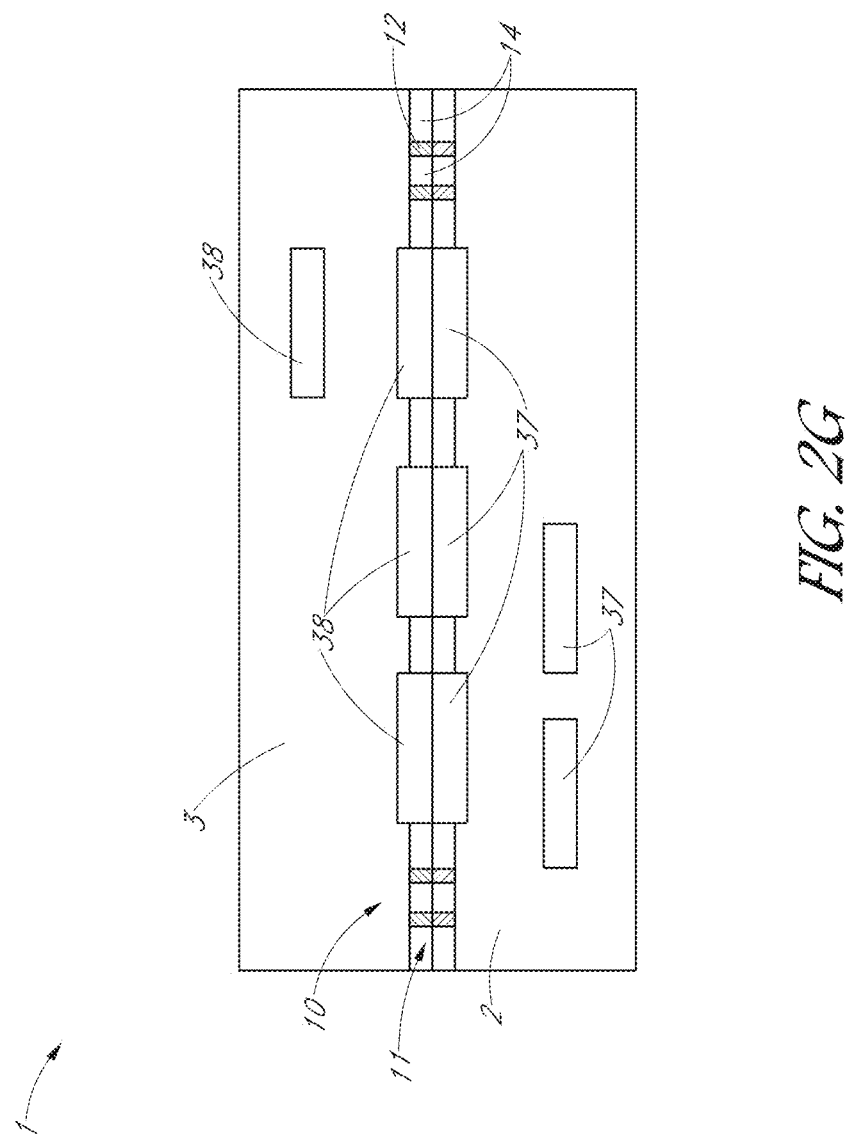
FIG. 2G is a schematic side sectional view of a bonded structure, according to various embodiments.

FIG. 2G is a schematic side sectional view of a bonded structure 1, according to various embodiments. FIG. 2G is similar to FIGS. 1A and 2F, except in FIG. 2G, there may not be a cavity defined between the first and second semiconductor elements 3, 2. Rather, in the embodiment of FIG. 2G, the first and semiconductor elements 3, 2 may be bonded to one another without an intervening cavity. In the illustrated embodiment, as with the embodiments described herein, the semiconductor elements 3, 2 can be bonded to one another by way of an interface structure 10 that defines an effectively annular pattern or profile about the interior of the elements 3, 2. As explained herein, the semiconductor elements 3, 2 can be directly bonded to one another along at least the interface structure 10 to define the effectively annular profile, with conductive and nonconductive interface features defined therein. The effectively annular profile of the interface structure 10 can comprise any of the patterns disclosed herein. Even though there may be no cavity in the bonded structure 1 of FIG. 2G, the interface structure 10 may define an effective seal so as to protect sensitive electronic circuits or components 37 in the interior of the structure 1 from the outside environs, including, e.g., gases. It should be appreciated that any of the embodiments disclosed herein may be used in conjunction with bonded structures that do not include a cavity.

Moreover, as illustrated in FIG. 2G, the first semiconductor element 3 can comprise one or more electronic components 38 formed at or near the surface of the element 3, and/or within the body of the element 3. The second semiconductor element 3 can also include one or more electronic components 37 formed at or near the surface of the element 2, and/or within the body of the second semiconductor element 3. The electronic components 37, 38 can comprise any suitable type of element, such as electronic circuitry that includes transistors, etc. The components 37, 38 can be disposed throughout the elements 3, 2 in any suitable arrangement. In the embodiment of FIG. 2G, the first and second elements 3, 2 can comprise any combination of device dies, such as any combination of processor dies, memory dies, sensor dies, etc. In the illustrated embodiment, the interface structure 10 can be disposed about the periphery of the bonded structure 1 so as to seal the interior of the bonded structure 1 from the outside environs. In various embodiments, therefore, the interior of the bonded structure 1, e.g., the region within the effectively annular pattern defined by the interface structure 10, may or may not be directly bonded. In the illustrated embodiment, some components 37, 38 may be disposed within an interior region of the bonded structure 1, e.g., within the effectively closed profile defined by the interface structure 10. A first interconnect of the first semiconductor element 3 and a second interconnect of the second semiconductor element 2 can be directly bonded to one another within the interior region of the bonded structure 1 to connect components 37, 38 in the respective elements 3, 2. In addition, additional components may be disposed outside the interior region defined by the interface structure 10. Such additional components (such as integrated device dies) may also be directly bonded to one another outside the interior region.

Figure 2H:
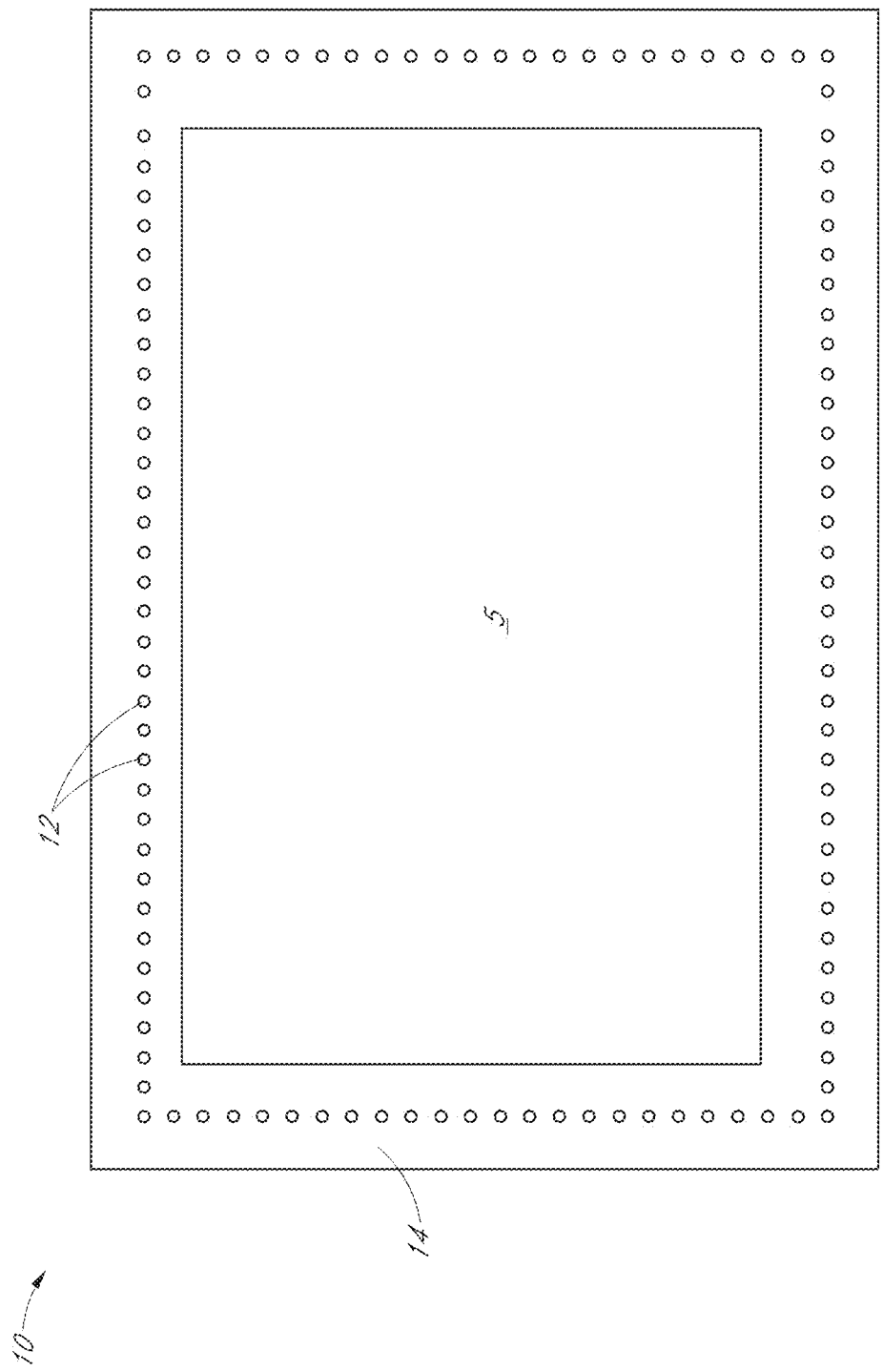
Figure 21:
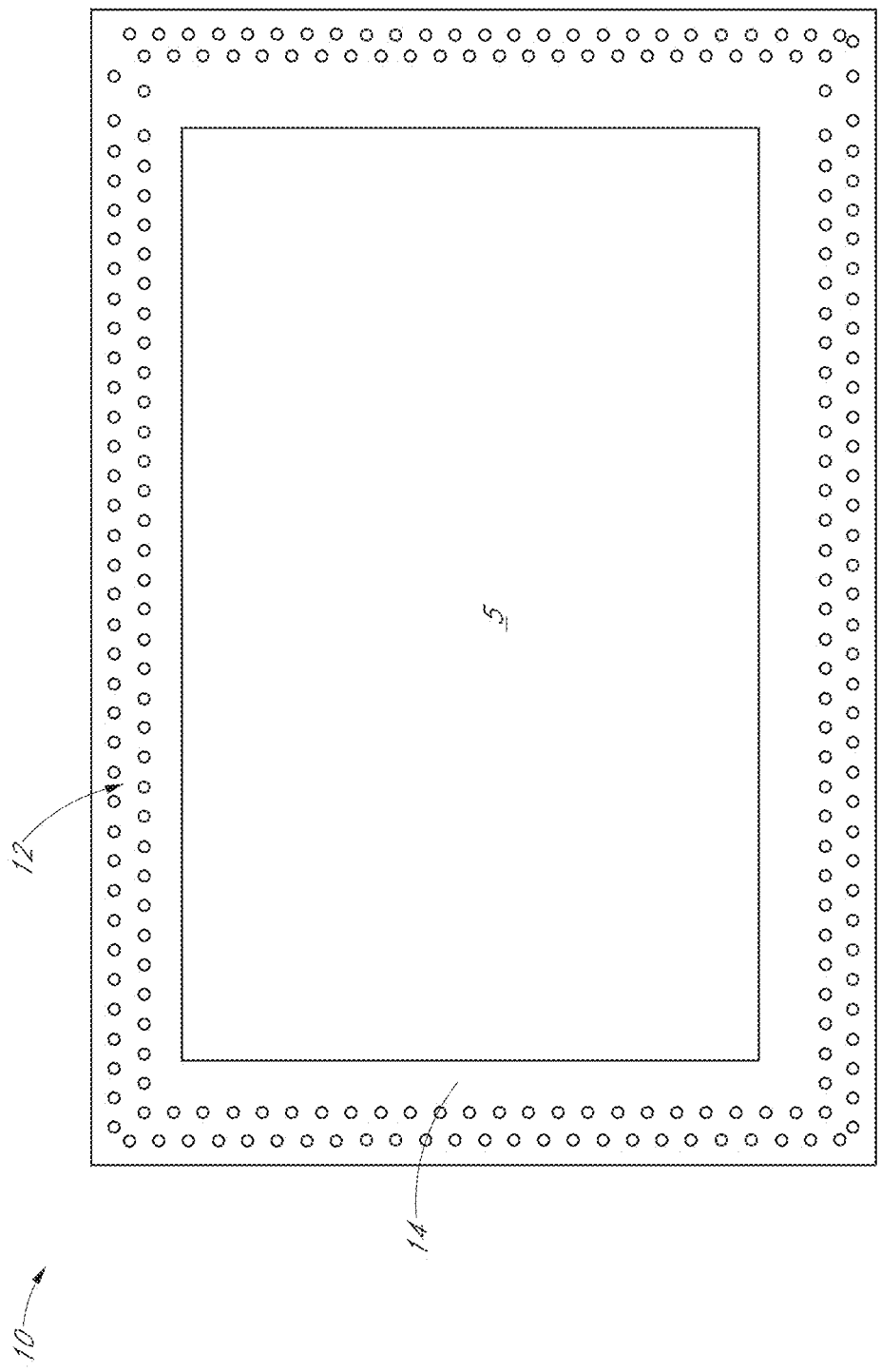

FIGS. 2H and 2I are schematic plan views of interface structures 10 that comprise conductive interface features 12 including an array of conductive dots, as seen from the plan view. In FIG. 2H, the conductive interface features 12 comprise a ring of closely spaced dots about the cavity 5 (or the interior of the bonded structure generally). In FIG. 2I, the conductive interface features 12 comprise multiple rings of closely spaced dots, with an outer ring of features laterally offset relative to the inner ring of features so as to improve the sealability of the interface structure 10. Although two rings of features 12 are shown in FIG. 2I, it should be appreciated that the conductive features 12 can comprise a mesh of dots or discrete shapes spaced from one another so as to define the effectively annular pattern. The conductive interface features 12 and the nonconductive interface feature 14 can cooperate to define an effectively annular or effectively closed pattern that connects two semiconductor elements. It should be appreciated that, although the dots shown in FIGS. 2H-2I are illustrated as rounded (e.g., circular or elliptical), in other embodiments, the dots can comprise any suitable discrete shapes such as polygons. Moreover, as explained herein, in some embodiments, the conductive interface features 12 (e.g., the dots) may only act as bonding mechanisms between the two semiconductor elements 3, 2. In other embodiments, however, some or all conductive interface features 12 may act as electrical interconnects (such as the ends of the interconnects 20 or pads connected thereto) to provide electrical communication between the semiconductor elements 3, 2. It should be appreciated that the features of FIGS. 2H and 2I can be combined with the various other embodiments disclosed herein.

Figure 3:
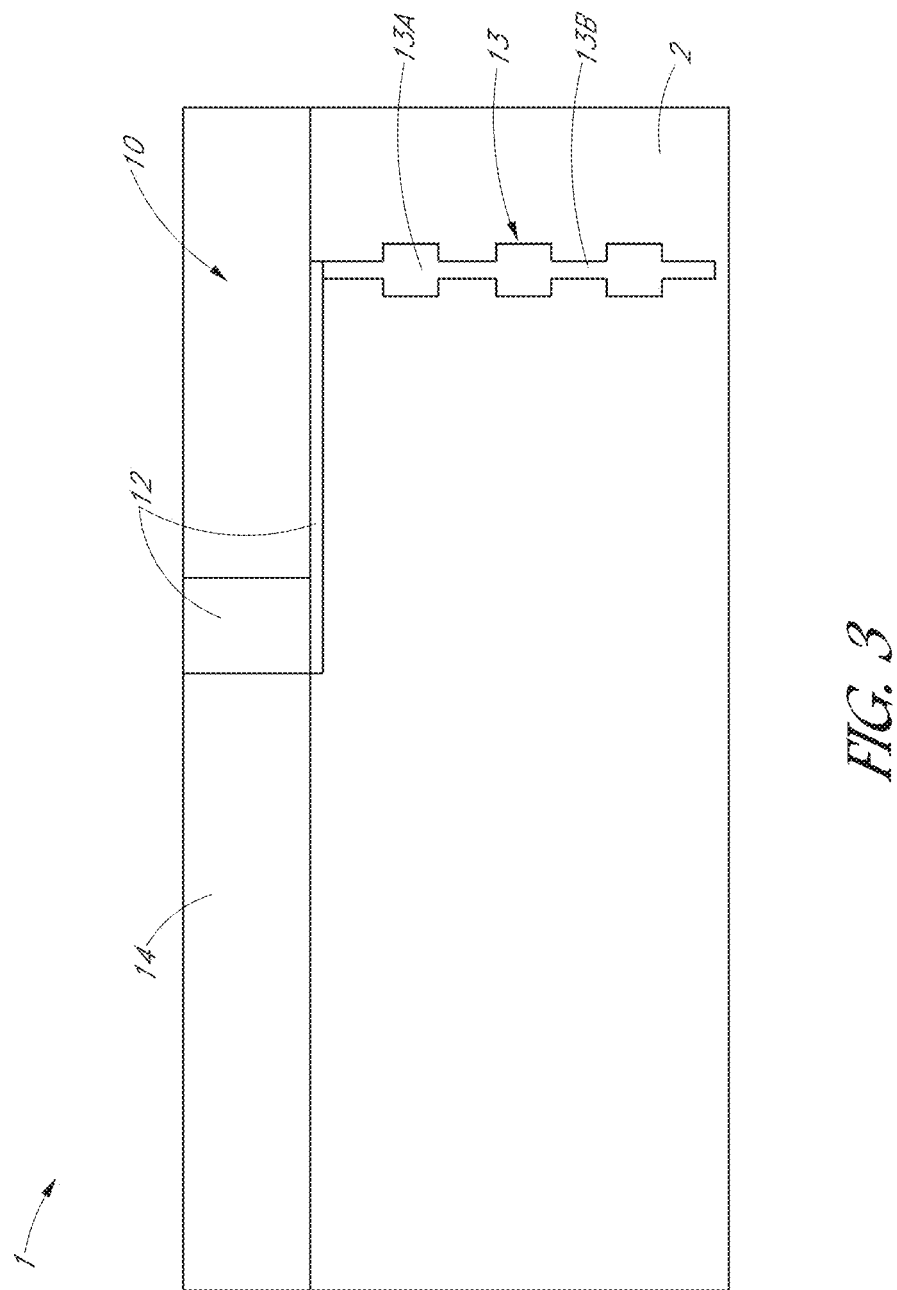
FIG. 3 is a schematic side sectional view of a portion of a bonded structure that includes a crack stopper connected with the conductive interface features of the interface structure.

FIG. 3 is a schematic side sectional view of a portion of a bonded structure 1 that includes a crack stopper 13 connected with the conductive interface features 12 of the interface structure 10. The crack stopper 13 includes alternating wider and narrower segments as it vertically connects through back-end-of-line interconnect structures within the die, and accordingly can prevent or reduce the propagation of cracks in one of the semiconductor elements (e.g., the second element 2). By introducing low K dielectrics into the back-end of the line (BEOL) interconnect layer of a functional device die, the fracture resistance of the dielectric may be substantially reduced and may be comparable or significantly lower than that of silicon. Therefore, preventing cracking and delamination of the low K dielectric layers at the edge of a die may be challenging under the stresses that arise from chip package interactions. Beneficially, cracking at the edge of the chip can be reduced by incorporating the patterned metal interface structures (e.g., the crack stopper 13) around the perimeter in the low K dielectrics that act as a crackstop by increasing the fracture resistance near the edge of the chip.

Figure 4C:
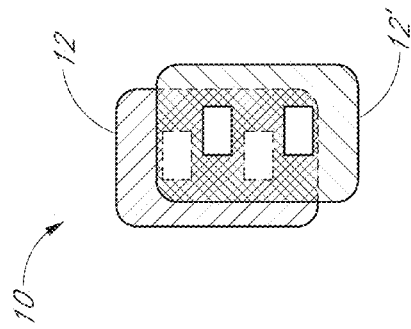
FIGS. 4A-4C are schematic plan views of bonded structures that increase tolerance for misalignments when corresponding interface features are bonded together.
Figure 4B:
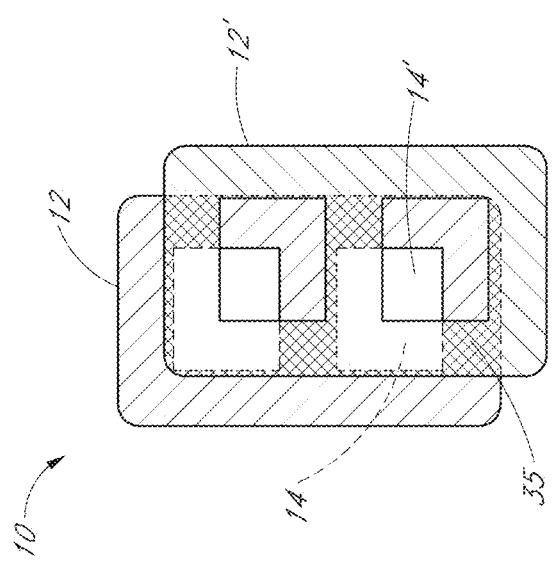
Figure 4A:
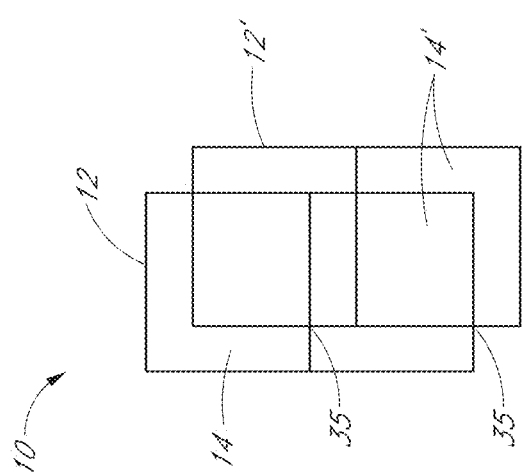

FIGS. 4A-4C are schematic plan views of bonded structures 10 that increase tolerance for misalignments when corresponding interface features from each of the semiconductor elements 3, 2 are bonded together. In some embodiments, the bonded structures 10 of FIGS. 4A-4C can be arranged to provide an effective gas seal when corresponding conductive interface features 12, 12' from adjacent semiconductor elements are misaligned. As explained herein, in various embodiments, the interface structure 10 can be defined by first interface features disposed on the first semiconductor element 3 and second interface features disposed on the second semiconductor element 2. For example, as shown in FIGS. 4A-4C, a first conductive interface feature 12 and a first non-conductive interface feature 14 can be disposed on the first semiconductor element 3. A second conductive interface feature 12' and a second non-conductive interface feature 14' can be disposed on the second semiconductor element 2. The first and second interface features can comprise the materials described above in connection with FIGS. 1A-2B. For example, in various embodiments, the first and second conductive interface features 12, 12' can comprise copper. In various embodiments, the first and second non-conductive interface features 14, 14' can comprise silicon oxide.

As with the bonded structures 1 of FIGS. 1A-2B, in some embodiments, the interface structure 10 of FIGS. 4A-4C can extend around the cavity 5 and/or integrated device 4 to define an effectively annular pattern, e.g., the conductive features can delimit a complete annulus or an incomplete annulus that define an effectively annular pattern. Disposing the interface structure 10 in an effectively annular pattern can advantageously seal the cavity 5 and/or integrated device 4 from gases entering the bonded structure 1. In other embodiments, however, the interface structure 10 of FIGS. 4A-4C can be used as an interface for applications other than, or in addition to, gas sealing. For example, the interface structure 10 of FIGS. 4A-4C can be used in any application to account for misalignment when conductive features are bonded to one another. In some embodiments, the interface structure 10 of FIGS. 4A-4C can provide one or more direct electrical and/or mechanical connections between the semiconductor elements. In various embodiments, the interface structure 10 of FIGS. 4A-4C may or may not be disposed about the integrated device 4 in an annular pattern. In some embodiments, for example, the interface structure 10 may be disposed at a plurality of discrete locations on the corresponding external surfaces of the semiconductor elements, such as for the interconnects 20 described below with respect to FIG. 7C. In such embodiments, the interface structure 10 can act as an electrical interconnection between the semiconductor elements. The first and second interface features can be bonded to one another in a variety of ways. In some embodiments, the first and second interface features can be directly bonded to one another without an intervening adhesive and without the application of pressure and/or temperature.

In embodiments that utilize direct bonding for the interface structure 10, bonding surfaces of the first and second interface features can be prepared. For example, a bonding surface of the first conductive interface feature 12 and the first non-conductive interface feature 14 can be directly bonded to a corresponding bonding surface of the second conductive interface feature 12' and the second non-conductive interface feature 14', without an intervening adhesive and without the application of pressure or a voltage. The bonding surfaces can be polished or planarized, activated, and terminated with a suitable species. The bonding surfaces can be brought into contact to form a direct bond without application of pressure. In some embodiments, the semiconductor elements 3, 2 can be heated to strengthen the bond, for example, a bond between the conductive features. Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; and 8,735,219, and throughout U.S. patent application Ser. Nos. 14/835,379; 62/278,354; 62/303,930; and 15/137,930, the contents of each of which are hereby incorporated by reference herein in their entirety and for all purposes.

In the structure 10 of FIG. 4A, the conductive interface features 12, 12' are relatively thin, such that dishing from polishing can be avoided and direct metal-to-metal bonding facilitated. If the respective interface features are laterally misaligned, however, a conductive bond 35 between the features 12, 12' is relatively small. The conductive bonds 35 shown in FIG. 4A may comprise isolated regions of contact, which may provide an inadequate gas seal (and/or an inadequate electrical connection).

Accordingly, as shown in FIGS. 4B-4C, the conductive interface features 12, 12' can be made sufficiently wide so as to ensure adequate conductivity of electrical connections and also provide a better diffusion barrier. The thick conductive features 12, 12' of FIGS. 4B-4C can advantageously enable larger conductive bonds 35, and also improve the gas sealing capabilities (and/or electrical connections) of the interface structure 10. In FIG. 4B, for example, the thickness of the conductive features 12, 12' can be made to be thicker than a maximum misalignment tolerance of the bonding procedure. Thus, if a bonding procedure has a misalignment tolerance of T, then the lateral thickness of the conductive interface features 12, 12' can be greater than or equal to T. In various direct bonding procedures, for example, the misalignment tolerance T can be in a range of 0.1 microns to 25 microns. Dimensioning the thickness of the conductive feature 12, 12' to equal or exceed the maximum misalignment tolerance T of the bonding process can ensure that the conductive bond 35 forms a closed structure.

In the embodiment of FIG. 4C, the thickness of the conductive interface features 12, 12' can be selected to be larger than the space provided for the intervening non-conductive interface features 14, 14'. Thus, in FIG. 4C, the conductive features 12 can be thicker than the non-conductive features 14, 14'. Dimensioning the conductive features 12 in such a manner can ensure that the conductive features 12, 12' mate along a continuous interface. Accordingly, the relatively thick conductive features 12, 12' of FIGS. 4B-4C can provide effective connection between conductive interface features 12, 12' during bonding even in the presence of misalignment, and a continuous interface can provide an annular or mostly annular barrier to diffusion.

FIGS. 5A-5D are schematic plan views of an interface structure 10 that increase tolerance for misalignments when corresponding interface features 10A, 10B on each semiconductor element 3, 2 are bonded together, while providing an effective metal diffusion barrier. As explained above in connection with FIGS. 4A-4C, it can be important to account for misalignments when bonding (e.g., direct bonding) two corresponding interface features 10A, 10B. The interface features 10A, 10B can be disposed on exterior surfaces of the first and second semiconductor elements 3, 2, respectively. The interface features 10A, 10B can comprise one or more conductive interface features 12, 12', which can also be embedded in or coupled with one or more non-conductive interface features 14, 14'. The conductive interface features 12, 12' can be brought together and directly bonded without an intervening adhesive in some embodiments. In some embodiments, the non-conductive interface features 14, 14' can also be directly bonded to one another. In other embodiments, an adhesive can be used to bond the elements. The conductive features 12, 12' can define a conductive bond 35 along regions where the features 12, 12' overlap with one another.

To increase tolerance for misalignments, the conductive interface features 12, 12' can comprise a plurality of wide sections 16 alternately arranged and connected with a plurality of narrow sections 15. For example, as shown in FIG. 5A, each wide section 16 can be connected between two narrow sections 15, and each narrow section 15 can be connected between two wide sections 16. The narrow section 15 can have a first width t in a range of 0.1 microns to 25 microns. The wide section can have a second width w less than t and in a range of 0.5 microns to 50 microns. Moreover, as shown in FIG. 5A, the wide sections 16 can be spaced from one another by a first distance g in which the intervening non-conductive interface feature 14 can be disposed. the wide and narrow sections 16, 15 can be connected end-to-end, the narrow sections 15 can have a length that is the same as the first distance g. The first distance g can be in a range of 0.1 microns to 50 microns. The thin sections can be spaced from one another by a second distance h, which may also comprise a length of the wide sections 16. The second distance h can be in a range of 0.2 microns to 50 microns. Moreover, an outermost edge of the wide sections 16 can be offset relative to an outermost edge of the narrow sections 15 by a lateral offset x, which as explained below can correspond to the bonding procedure's maximum alignment tolerance in the x direction. The lateral offset x can be in a range of 0.1 microns to 25 microns.

Advantageously, the wide segments 16 can be provided to improve the gas sealing capabilities of the bonded structure 1, as explained above. The narrow segments 14 can be provided to reduce the effects of dishing that may occur due to polishing, thereby facilitating direct conductor to conductor bonding. FIG. 5B illustrates the interface structure 10 after bonding in which there is little to no misalignment of the respective interface features 10A, 10B. As shown in FIG. 5B, the conductive features 12, 12' completely overlap one another at a half-pitch offset in the y-direction as shown in FIG. 5A such that the bonded conductive regions provide closed pathways at a large conductive bond 35. As shown in FIG. 5B, in the case where there is little to no misalignment, the conductive features 12, 12' completely overlap laterally at the conductive bond 35, i.e., parallel to the lateral offset x, because the lateral offset of the outermost edge of the wide sections 16 can be selected to correspond to the bonding procedures' maximum alignment tolerance. For example, for a lateral misalignment tolerance x for a particular bonding procedure, the first and second widths t, w can be selected to satisfy the relationship x<(w−t)/2. For a longitudinal misalignment tolerance y during bonding, for a particular bonding procedure, the first and second distances g, h can be selected to satisfy the relationship y<(h−g)/2. Satisfying these relationships ensure that a continuous overlap, or bond line, between the conductive features 12, 12' of the different semiconductor elements 3, 2.

Figure 5D:
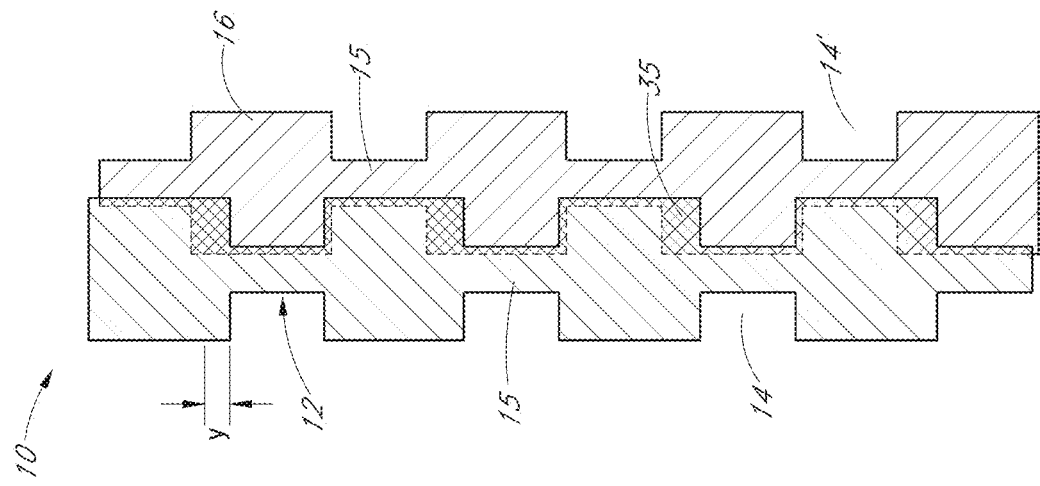
Figure 5C:
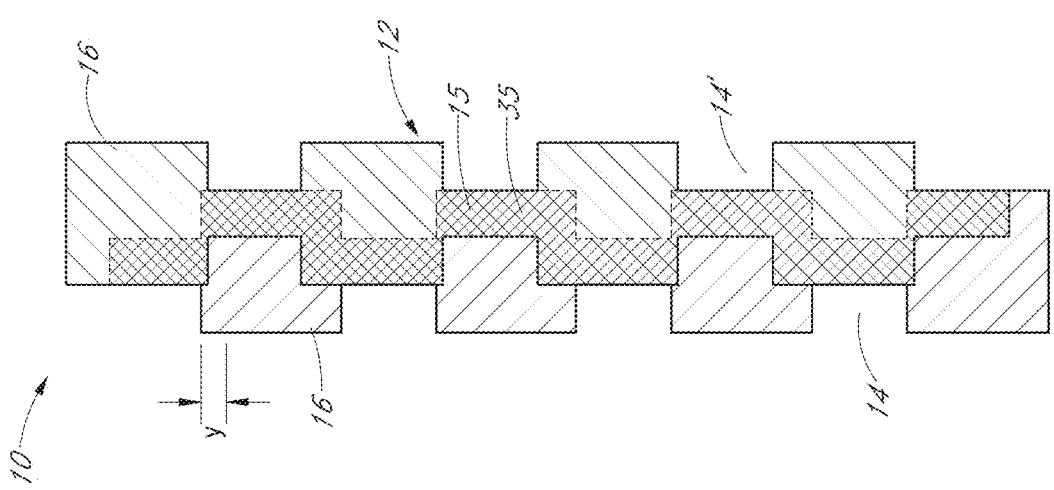

FIG. 5C illustrates the bonded interface structure 10 when the interface feature 10A, 10B are misaligned laterally by the misalignment tolerance x and longitudinally by the misalignment tolerance y. As shown in FIG. 5C, even when the interface features 10A, 10B are misaligned by x and y for a particular bonding procedure, the resulting bonded interface structure 10 comprises significant and continuous overlap between the conductive interface features 12, 12' at the conductive bond 35, which can provide an effectively annular diffusion barrier, e.g., a completely annular or mostly annular barrier to diffusion.

FIG. 5D illustrates the bonded interface structure 10 when the interface features 10A, 10B are misaligned laterally by the misalignment tolerance x plus the first width t, with longitudinal misalignment less than (h−g)/2. As shown in FIG. 5D, when there is longitudinal misalignment less than (h−g)/2 (e.g., parallel to y), the bonded interface structure 10 of FIG. 5D can accommodate lateral misalignments that are even larger than the misalignment tolerance x of the bonding procedure, because the additional width of the narrow sections 15 can contribute additional bonding regions at the conductive bond 35 when there is longitudinal misalignment less than (h−g)/2. While the overlapping bond region is laterally less wide than in FIG. 5C, the metal to metal bond interface remains continuous and provides a better diffusion barrier than, for example, oxide.

Figure 6A:
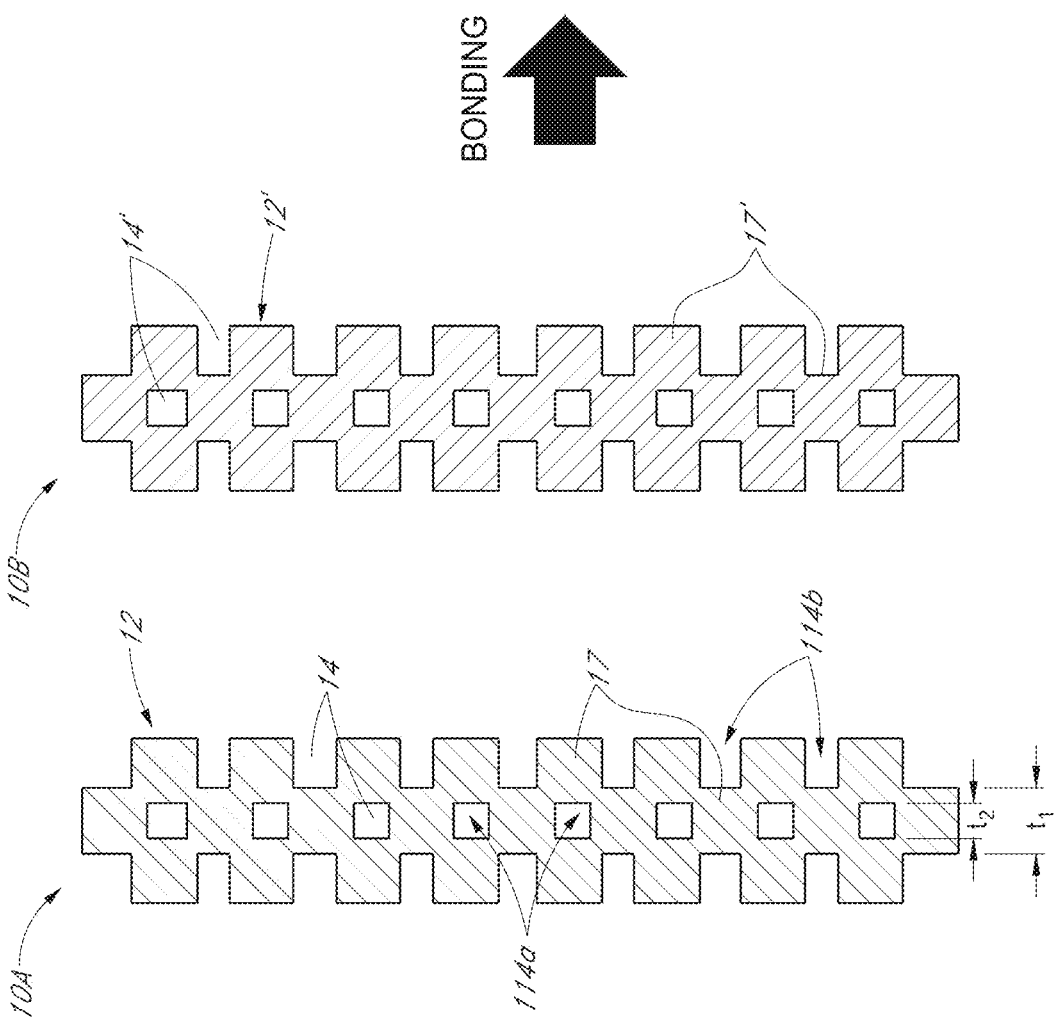
FIGS. 6A-6B are schematic plan views of an interface structure that increases tolerance for misalignments when corresponding interface features on each semiconductor element are bonded together, according to another embodiment.
Figure 6B:
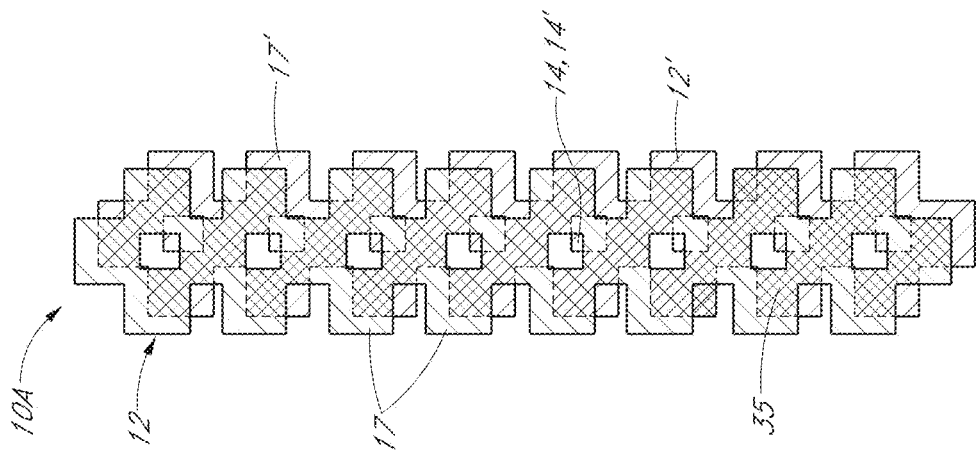

FIGS. 6A-6B are schematic plan views of an interface structure 10 that increases tolerance for misalignments when corresponding interface features 10A, 10B on each semiconductor element 3, 2 are bonded together, according to another embodiment. In the embodiment of FIGS. 6A-6B, the non-conductive interface features 14, 14' can comprise a plurality of inner regions 114a and a plurality of outer regions 114b. The inner regions 114a can be completely surrounded (in a horizontal plane) by the conductive interface features 12, 12'. In the illustrated embodiment, the plurality of the conductive interface features 12, 12' can comprise a number of blocks 17 that are disposed around (e.g., completely around) the inner regions 114a of the non-conductive interface regions 14, 14'. The outer regions 114b of the non-conductive interface regions 14, 14' can be disposed in gaps between adjacent outer blocks 17.

In some embodiments, a first width $t_1$ of the blocks 17 can be greater than a second width $t_2$ of the inner regions 114a and/or the outer regions 114b. For example, in some embodiments, the first width $t_1$ of the blocks 17 can be in a range of 0.2 microns to 25 microns. The second width $t_2$ of the inner regions 114a and/or the outer regions 114b can be in a range of 0.1 microns to 20 microns. Dimensioning the blocks 17 to be larger than the regions 114a, 114b can enable the conductive features 12, 12' to have significant overlapping conductive bond 35, as shown in the bonded interface structure 10 of FIG. 6B.

Figure 7B:
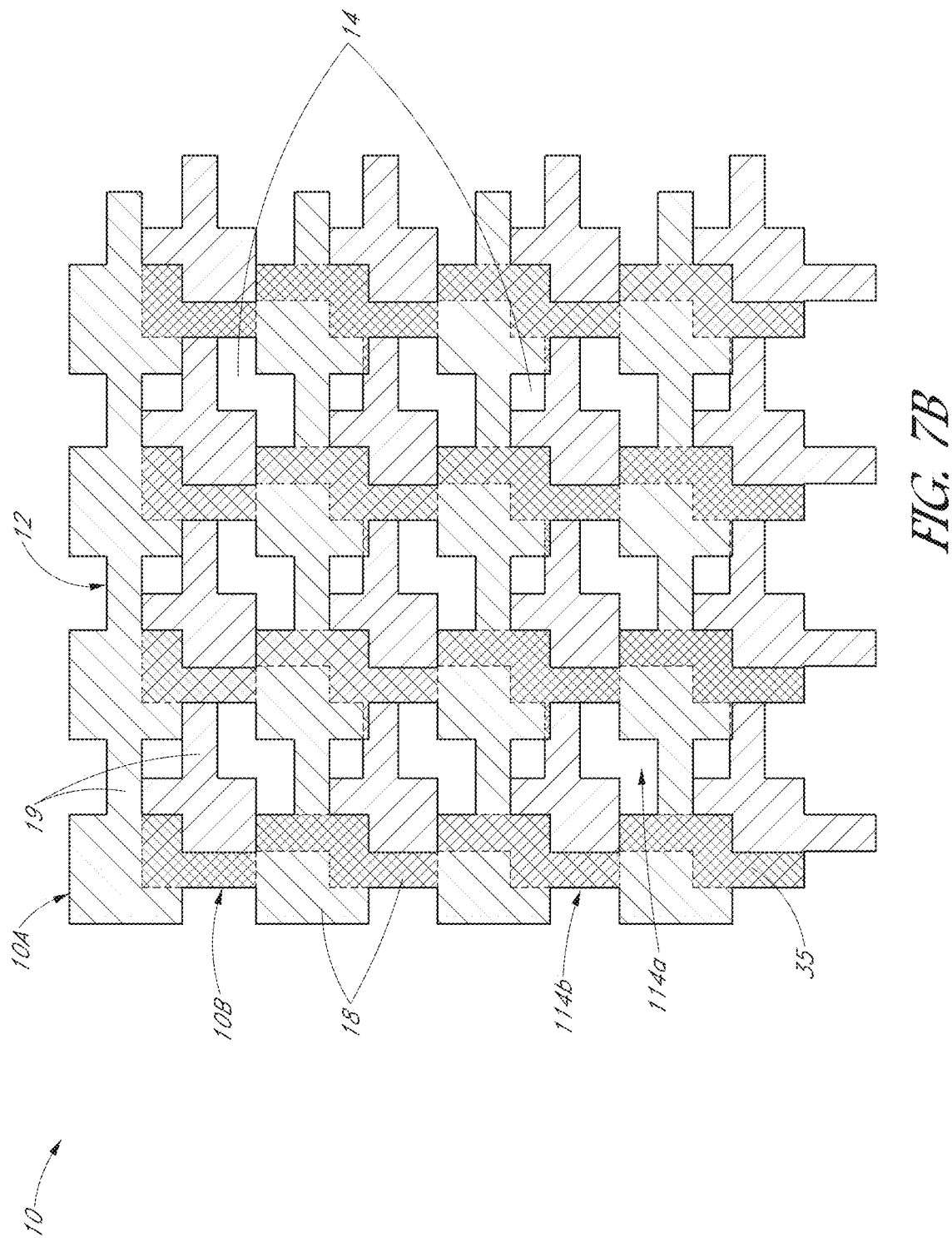
FIG. 7B is a schematic plan view of a bonded interface structure formed by bonding two interface features.

FIG. 7A is a schematic plan view of a conductive interface feature 10A in which a plurality of inner regions 114a of non-conductive interface features 14 are disposed within (surrounded by) a lattice. For example, the interface feature 10A shown in FIG. 7A comprises a crosswise grid structure defined by intersecting conductive interface features 12. FIG. 7B is a schematic plan view of a bonded interface structure 10 formed by bonding two interface features 10A, 10B. As shown in FIG. 7A, the conductive feature 12 can include a plurality of wide blocks 18 interconnected by narrow conductive segments 19. The wide blocks 18 can provide improved gas sealing capabilities, and the narrow conductive segments 19 can be provided to avoid the negative effects of dishing due to polishing procedures, thereby facilitating direct metal to metal bonds. In FIG. 7A, the blocks 18 and segments 19 are arranged in a grid in which the conductive features 12 are disposed perpendicular to one another. However, in other embodiments, the features 12 can be arranged non-perpendicularly relative to one another.

In FIGS. 7A-7B, the blocks 18 can have a first width $t_1$ that is larger than a second width $t_2$ of a gap G disposed between adjacent blocks 18. For example, in some embodiments, the first width $t_1$ can be in a range of 0.2 microns to 50 microns. The second width $t_2$ can be in a range of 0.1 microns to 25 microns. As shown in FIG. 7B, spacing the blocks 18 in such a manner can beneficially enable large regions of overlap between the conductive features 12 along the conductive bond 35, and result in multiple adjacent metal bond lines, which can be beneficial for sealing the bonded structure 1 from gases.

Although the lattice shown in FIGS. 7A-7B comprises a grid of intersecting conductive lines, in other embodiments, the lattice can comprise curved, periodic, or irregular shapes. For example, in some embodiments, the lattice can comprise a honeycomb structure of interconnected polygons. In some embodiments, the lattice can comprise a plurality of triangles, a herringbone pattern, or any other suitable lattice of repeating shapes.

Figure 7C:
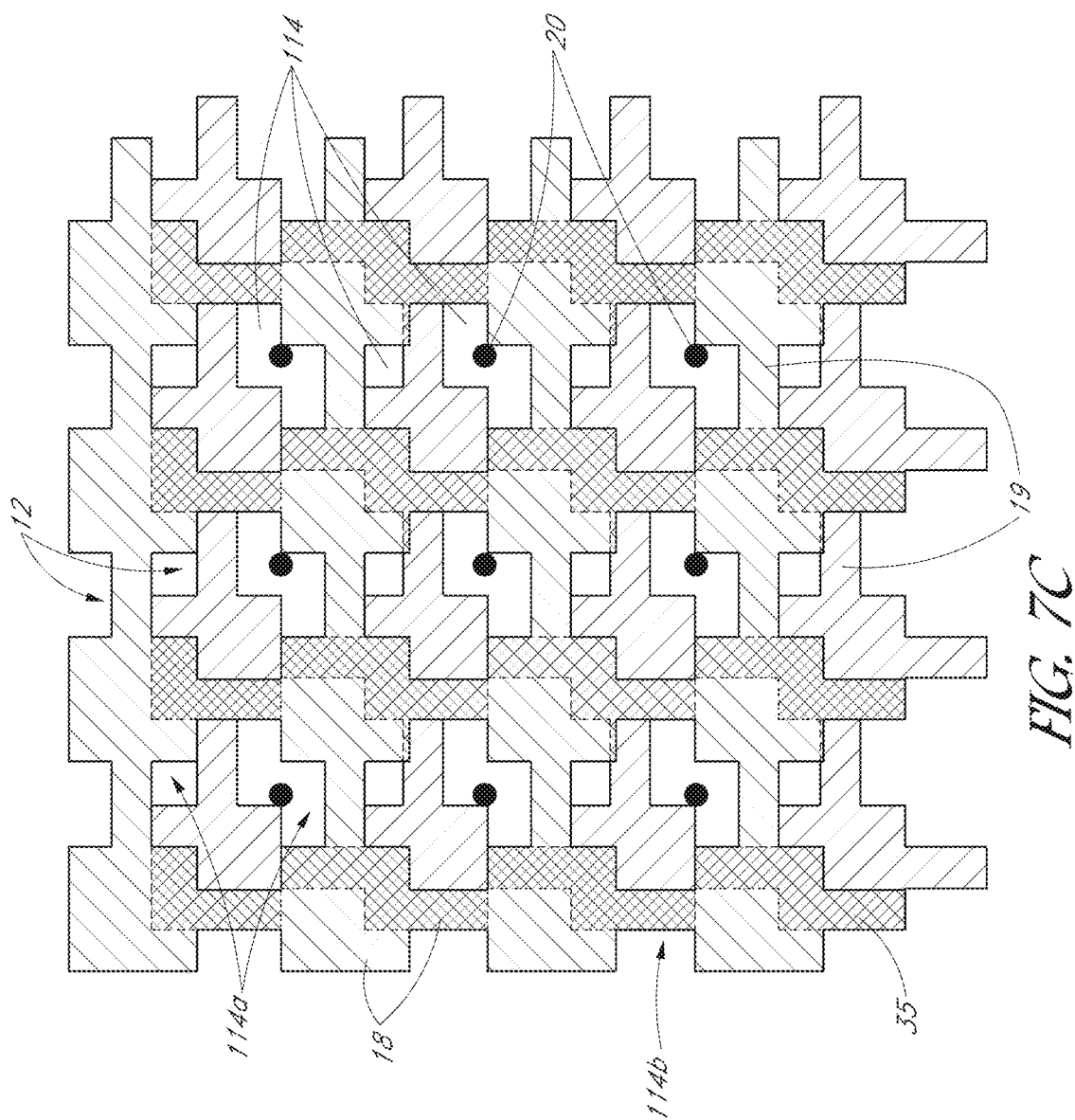
FIG. 7C is a schematic plan view of the bonded interface structure of FIG. 7B, with a plurality of electrical interconnects disposed within inner regions of the non-conductive interface feature.

FIG. 7C is a schematic plan view of the bonded interface structure 10 of FIG. 7B, with a plurality of electrical interconnects 20 disposed within the inner regions 114a of the non-conductive interface features 14. As explained above in connection with FIG. 2B, it can be advantageous to incorporate additional conductive electrical interconnects 20 into the interface structure 10. Doing so enables the bonded structure 1 to provide a gas seal and electrical communication for a large number of signal, power and/or ground lines between the semiconductor elements 3, 2. In the embodiment of FIG. 7C, for example, the conductive interface features 12 and the non-conductive interface features 14 can provide a mechanical connection between the semiconductor elements 3, 2 that acts as an effective barrier to gases entering the structure. The conductive features 12 can comprise elongate features with a length greater than a width. The electrical interconnects 20 can be disposed within the inner regions 114a and can be electrically isolated from the conductive features 12. The interconnects can extend vertically from the first semiconductor element 3 to the second semiconductor element 2 through the non-conductive features 14 to provide electrical communication between the semiconductor elements 3, 2. It will be understood that the effectively annular patter, e.g., a completely or mostly annular pattern, created by overlap and bonding of the two conductive features 12 can also serve as additional or sole electrical connection between the two semiconductor elements 3, 2.

Thus, in the embodiments of FIGS. 4B-7C, the first semiconductor element 3 can comprise a first pattern of repeating shapes formed from conductive lines on an exterior surface of the first semiconductor element 3. The first pattern can comprise a first conductive interface feature 12 spaced apart by a first spacing from a second conductive interface feature 12, with a first non-conductive interface feature 14 being disposed between the first and second conductive interface features 12. The first conductive interface feature 12 can have a first width that is greater than the first spacing. The second semiconductor element 2 can have a second pattern of repeating shapes formed from conductive lines on an exterior surface of the second semiconductor element 2. The second pattern can comprise a third conductive interface feature 12 spaced apart by a second spacing from a fourth conductive interface feature 12, with a second non-conductive interface feature 14 being disposed between the third and fourth conductive interface features 12. The third conductive interface feature 12 can have a second width that is greater than the second spacing. The first and second conductive interface features 12 can be bonded to the third and fourth conductive interface features 12 to define an interface structure 10. Even though the first and second patterns may be laterally offset relative to one another, the bonded first and second patterns can nevertheless delimit a continuous conductive bond region 35 along the interface structure 10.

Figure 8:
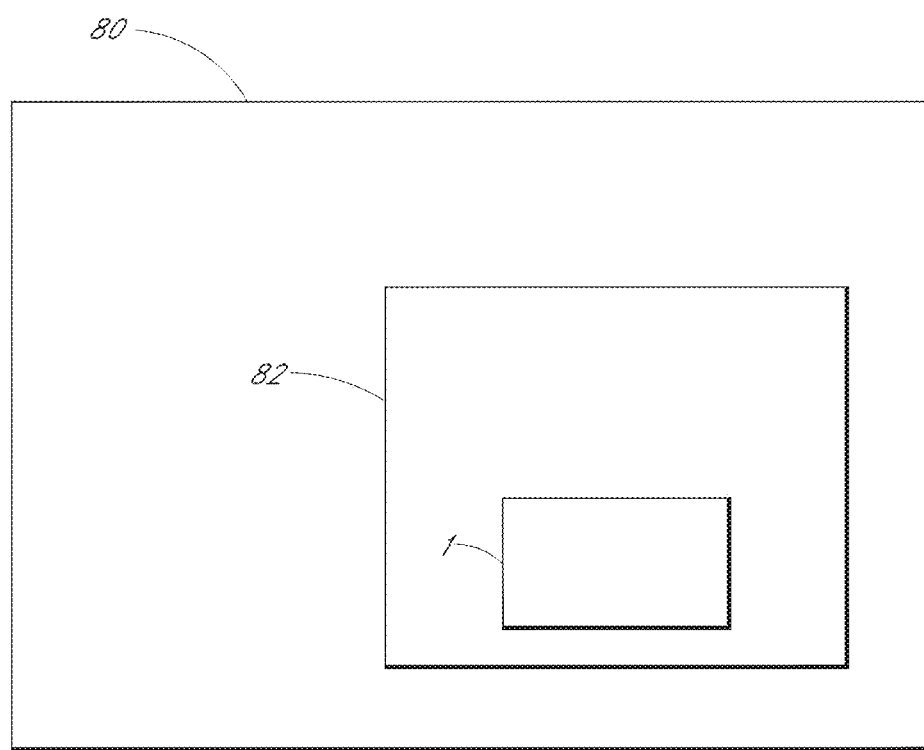
FIG. 8 is a schematic diagram of an electronic system incorporating one or more bonded structures, according to various embodiments.

FIG. 8 is a schematic diagram of an electronic system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The system 80 shown in FIG. 8 can comprise any of the bonded structures 1 and associated interface structure 10 shown and described herein.

In one embodiment, a bonded structure comprising is disclosed. The bonded structure can include a first element having a first interface feature, and a second element having a second interface feature. The bonded structure can include an integrated device coupled to or formed with the first element or the second element. The first interface feature can be directly bonded to the second conductive interface feature to define an interface structure. The interface structure can be disposed around the integrated device to define an effectively closed profile to connect the first and second elements. The effectively closed profile can substantially seal an interior region of the bonded structure from gases diffusing into the interior region from the outside environs.

In another embodiment, a bonded structure comprises a first element and a second element. The bonded structure can include an integrated device coupled to or formed within the first element or the second element. An interface structure can be disposed between the first element and the second element. The interface structure can comprise a first conductive interface feature extending in a direction from the first element to the second element, a second conductive interface feature extending in a direction from the first element to the second element, and a solid state non-conductive interface feature disposed laterally between the first and second conductive interface features. The interface structure can be disposed about the integrated device to define an effectively closed profile to connect the first element and the second element.

In another embodiment, a bonded structure comprises a first element and a second element. An integrated device can be coupled to or formed with the first element or the second element. An interface structure can be disposed between the first element and the second element, the interface structure extending in a direction from the first element to the second element. The interface structure can include a first elongate conductive interface feature extending in a direction from the first element to the second element and a second elongate conductive interface feature extending in a direction from the first element to the second element. The first and second elongate conductive interface features can be spaced apart by an intervening non-conductive interface feature extending in a direction from the first element to the second element. Each of the first and second elongate conductive interface features can have a length greater than a width. An electrical interconnect can be in electrical communication with the integrated device, the electrical interconnect extending from the first element to the second element. The electrical interconnect can extend through the intervening non-conductive interface feature between the first and second conductive interface features.

In another embodiment, a bonded structure comprises a first element having a first pattern of repeating shapes formed from conductive lines on an exterior surface of the first element. The first pattern can comprise a first conductive interface feature spaced apart by a first spacing from a second conductive interface feature, a first non-conductive interface feature being disposed between the first and second conductive interface features. The first conductive interface feature can have a first width that is greater than the first spacing. The bonded structure can comprise a second element having a second pattern of repeating shapes formed from conductive lines on an exterior surface of the second element. The second pattern can comprise a third conductive interface feature spaced apart by a second spacing from a fourth conductive interface feature. A second non-conductive interface feature can be disposed between the third and fourth conductive interface features, the third conductive interface feature having a second width that is greater than the second spacing. The first and second conductive interface features can be bonded to the third and fourth conductive interface features to define an interface structure. The first and second patterns can be laterally offset relative to one another but delimiting a continuous conductive bond region along the interface structure.

In another embodiment, a bonded structure is disclosed. The bonded structure can include a first element and a second element. An integrated device can be coupled to or formed with the first element or the second element. An interface structure can be disposed between the first element and the second element. The interface structure can comprise a first conductive interface feature laterally enclosing the integrated device. The conductive interface feature can continuously extend between the first and second elements to form at least one of an electrical, mechanical, or thermal connection between the two elements. A non-conductive interface feature can continuously extend between the first and second elements.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A bonded structure comprising:
    a first element comprising an integrated device and a first plurality of conductive interface features at least partially embedded in a first nonconductive interface feature, each of the first plurality of conductive interface features comprising a first plurality of discrete shapes spaced apart from one another by the first nonconductive interface feature, the first plurality of discrete shapes disposed in a ring about the integrated device as seen from a plan view, the first element further comprising a patterned metal structure connected to a first conductive interface feature of the first plurality of conductive interface features, the patterned metal structure comprising alternating wide and narrow segments extending vertically through at least a portion of the first element; and
    a second element comprising a second plurality of conductive interface features at least partially embedded in a second nonconductive interface feature, the second plurality of conductive interface features directly bonded to the first plurality of conductive interface features and the second nonconductive interface feature directly bonded to the first nonconductive interface feature.

2. The bonded structure of claim 1, wherein, as seen from the plan view, the first plurality of conductive features comprises an array of multiple rings of discrete shapes disposed about the integrated device.

3. The bonded structure of claim 2, wherein, as seen from the plan view, the multiple rings comprise a second ring of discrete shapes laterally offset from the ring.

4. The bonded structure of claim 3, wherein, as seen from the plan view, the ring comprises a first discrete shape and a second discrete shape offset from the first discrete shape in a first direction by a gap, the second ring comprising a third discrete shape offset from the gap in a second direction transverse to the first direction.

5. The bonded structure of claim 1, wherein the ring of discrete shapes defines an effectively closed profile to connect the first and second elements.

6. The bonded structure of claim 5, wherein the effectively closed profile substantially seals an interior region of the bonded structure from gases diffusing into the interior region.

7. The bonded structure of claim 1, wherein, as seen in a plan view, each of the second plurality of conductive interface features comprises a second plurality of discrete shapes spaced apart by the second nonconductive interface feature.

8. The bonded structure of claim 1, wherein, as seen in the plan view, the first plurality of discrete shapes comprises a plurality of dots.

9. The bonded structure of claim 1, wherein, as seen in the plan view, the first plurality of discrete shapes comprises a plurality of polygons.

10. The bonded structure of claim 1, wherein, as seen in the plan view, the first plurality of discrete shapes comprises a plurality of circles or ellipses.

11. The bonded structure of claim 1, wherein the patterned metal structure comprises a first segment at a first vertical location below a bonding surface of the bonded structure and a second segment at a second vertical location below the bonding surface, the first segment wider than the second segment.

12. The bonded structure of claim 1, wherein no cavity is provided between the first and second elements.

13. The bonded structure of claim 1, wherein at least one of the first and second elements comprises a processor die.

14. The bonded structure of claim 1, wherein at least one of the first and second elements comprises a sensor die.

15. A bonded structure comprising:
a first element having a first plurality of conductive interface features at least partially embedded in and spaced apart from one another by a first nonconductive interface feature, the first element further comprising a first patterned metal structure connected to a first conductive interface feature of the first plurality of conductive interface features, the patterned metal structure comprising a first segment at a first vertical location below a bonding surface of the first element and a second segment at a second vertical location below the bonding surface, the first segment wider than the second segment;
a second element having a second plurality of conductive interface features at least partially embedded in and spaced apart from one another by a second nonconductive interface feature, the first plurality of conductive interface features directly bonded to the second plurality of conductive interface features and the first nonconductive interface feature directly bonded to the second nonconductive interface feature; and
an integrated device coupled to or formed with the first element or the second element, the directly bonded first and second pluralities of conductive interface features disposed in a ring about the integrated device as seen from a plan view.

16. The bonded structure of claim 15, wherein, as seen in a plan view, the ring comprises a plurality of discrete shapes spaced apart by the first nonconductive interface feature.

17. The bonded structure of claim 16, wherein, as seen from the plan view, the first plurality of conductive features comprises an array of multiple rings of discrete shapes disposed about the integrated device.

18. The bonded structure of claim 16, wherein, as seen in the plan view, each of the first plurality of conductive interface features comprises a plurality of dots.

19. The bonded structure of claim 16, wherein, as seen in the plan view, each of the first plurality of conductive interface features comprises a plurality of polygons.

20. The bonded structure of claim 16, wherein, as seen in the plan view, each of the first plurality of conductive interface features comprises a plurality of circles or ellipses.

21. The bonded structure of claim 15, wherein the ring defines an effectively closed profile to connect the first and second elements.

22. The bonded structure of claim 16, wherein the effectively closed profile substantially seals an interior region of the bonded structure from gases diffusing into the interior region.

23. A bonded structure comprising:
a first element having a first plurality of conductive interface features at least partially embedded in and spaced apart from one another by a first nonconductive interface feature, each of the first plurality of conductive interface features comprising a first plurality of discrete shapes spaced apart from one another by the first nonconductive interface feature, the first element further comprising a first patterned metal structure connected to a first conductive interface feature of the first plurality of conductive interface features, the patterned metal structure comprising alternating wide and narrow segments extending vertically through at least a portion of the first element;
a second element comprising a second plurality of conductive interface features at least partially embedded in and spaced apart from one another by a second nonconductive interface feature, each of the second plurality of conductive interface features comprising a second plurality of discrete shapes spaced apart from one another by the second nonconductive interface feature, the first plurality of conductive interface features directly bonded to the second plurality of conductive interface features and the first nonconductive interface feature directly bonded to the second nonconductive interface feature; and
an integrated device coupled to or formed with the first element or the second element, the first plurality of discrete shapes spaced apart from one another in a ring about the integrated device as seen from a plan view.

24. The bonded structure of claim 23, wherein, as seen from the plan view, the first plurality of conductive features comprises an array of multiple rings of discrete shapes disposed about the integrated device.

25. The bonded structure of claim 23, wherein the ring is disposed around the integrated device to define an effectively closed profile to connect the first and second elements.

26. The bonded structure of claim 25, wherein the effectively closed profile substantially seals an interior region of the bonded structure from gases diffusing into the interior region.

* * * * *

UNITED STATES PATENT AND TRADEMARK OFFICE
CERTIFICATE OF CORRECTION

PATENT NO. : 12,100,684 B2
APPLICATION NO. : 18/147212
DATED : September 24, 2024
INVENTOR(S) : Liang Wang et al.

Page 1 of 1

It is certified that error appears in the above-identified patent and that said Letters Patent is hereby corrected as shown below:

On the Title Page

Page 5: In Column 1, Line 25, item (56) under Other Publications, delete "High DensityPackage-on-Package" and insert --High Density Package-on-Package--.

In the Specification

In Column 15, Line 64, delete "relationship x<(w–t)/2. For" and insert --relationship x≤(w–t)/2. For--.

In Column 15, Line 67, delete "relationship y<(h–g)/2. Satisfying" and insert --relationship y≤(h–g)/2. Satisfying--.

Signed and Sealed this
Twenty-first Day of January, 2025

Coke Morgan Stewart
*Acting Director of the United States Patent and Trademark Office*